United States Patent
Inoue et al.

(10) Patent No.: US 9,537,096 B2
(45) Date of Patent: Jan. 3, 2017

(54) METHOD FOR PRODUCING ORGANIC ELECTROLUMINESCENT ELEMENT, AND ORGANIC ELECTROLUMINESCENT DISPLAY DEVICE

(71) Applicant: Sharp Kabushiki Kaisha, Osaka-shi (JP)

(72) Inventors: Satoshi Inoue, Osaka (JP); Katsuhiro Kikuchi, Osaka (JP); Shinichi Kawato, Osaka (JP); Takashi Ochi, Osaka (JP); Yuhki Kobayashi, Osaka (JP); Masahiro Ichihara, Mitsuke (JP); Eiichi Matsumoto, Mitsuke (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 14/900,541

(22) PCT Filed: May 1, 2014

(86) PCT No.: PCT/JP2014/062081
§ 371 (c)(1),
(2) Date: Dec. 21, 2015

(87) PCT Pub. No.: WO2014/203632
PCT Pub. Date: Dec. 24, 2014

(65) Prior Publication Data
US 2016/0149134 A1    May 26, 2016

(30) Foreign Application Priority Data

Jun. 21, 2013  (JP) .................................. 2013-131120

(51) Int. Cl.
*H01L 51/00*  (2006.01)
*C23C 14/24*  (2006.01)
(Continued)

(52) U.S. Cl.
CPC .......... *H01L 51/0011* (2013.01); *C23C 14/042* (2013.01); *C23C 14/24* (2013.01); *H01L 27/3244* (2013.01); *H01L 51/5012* (2013.01)

(58) Field of Classification Search
CPC .... C23C 14/042; C23C 14/24; H01L 27/3244; H01L 51/0011; H01L 51/5012
See application file for complete search history.

(56) References Cited

U.S. PATENT DOCUMENTS 4,325,986 A * 4/1982 Baron ...................... C23C 14/24
                                                        118/718
6,310,281 B1 * 10/2001 Wendt ................. H01L 31/0392
                                                         136/244
(Continued)

FOREIGN PATENT DOCUMENTS

| JP | 2004-225058 | 8/2004 |
| JP | 2009-127066 | 6/2009 |

(Continued)

OTHER PUBLICATIONS

Hastings et al., Angular distribution of flow from orifices and tubes at high Knudsen numbers, Journal of Vacuum Science & Technology, Jan. 1, 1967, vol. 4, pp. 10-18.*

(Continued)

*Primary Examiner* — Allan R Wilson
(74) *Attorney, Agent, or Firm* — Morrison & Foerster LLP

(57) ABSTRACT

The present invention provides a method for producing an organic EL element capable of shortening the film formation time while suppressing an increase in the blur width; and an organic EL display device. The method is for producing an organic EL element by scanning vapor deposition, in which one or more vapor deposition sources each are provided with ejection orifices that face the respective openings of a (Continued)

limiting plate, and the ejection orifices facing the same opening are spaced from each other to give a sum of distributions.

6 Claims, 11 Drawing Sheets

(51) Int. Cl.
*C23C 14/04* (2006.01)
*H01L 27/32* (2006.01)
*H01L 51/50* (2006.01)

(56) References Cited

U.S. PATENT DOCUMENTS

| | | | |
|---|---|---|---|
| 2002/0170484 A1* | 11/2002 | Katamine | C23C 16/4411 117/4 |
| 2004/0060514 A1* | 4/2004 | Janakiraman | C23C 16/45565 118/715 |
| 2008/0131587 A1* | 6/2008 | Boroson | C23C 14/042 427/66 |
| 2009/0133629 A1 | 5/2009 | Kamikawa et al. | |
| 2012/0183676 A1 | 7/2012 | Sonoda et al. | |

FOREIGN PATENT DOCUMENTS

| | | |
|---|---|---|
| JP | 2012-193391 | 10/2012 |
| WO | WO-2011/034011 | 3/2011 |

OTHER PUBLICATIONS

International Search Report mailed Aug. 5, 2014, directed to International Application No. PCT/JP2014/062081; 2 pages.

\* cited by examiner

METHOD FOR PRODUCING ORGANIC ELECTROLUMINESCENT ELEMENT, AND ORGANIC ELECTROLUMINESCENT DISPLAY DEVICE

CROSS-REFERENCE TO RELATED APPLICATIONS

This application is a national phase application under 35 U.S.C. 371 of International Application No. PCT/JP2014/062081, filed on May 1, 2014, and which claims priority to Japanese Patent Application No. 2013-131120, filed on Jun. 21, 2013, the contents of which are incorporated herein by reference in their entirety.

FIELD OF THE INVENTION

The present invention relates to a method for producing an organic electroluminescent element (hereinafter, also referred to as an organic EL element), and an organic electroluminescent display device (hereinafter, also referred to as an organic EL display device). More specifically, the present invention relates to a method of producing an organic EL element suited for production of an organic EL element for a large-sized substrate, and an organic EL display device provided with the organic EL element produced by the above production method.

BACKGROUND OF THE INVENTION

Flat-panel displays have recently been utilized in various products and fields. These flat-panel displays have been desired to have a larger size, higher display qualities, and lower power consumption.

Organic electroluminescent display devices including organic EL elements that utilize electroluminescence (hereinafter, also abbreviated as "EL") of an organic material have drawn much attention as an all-solid-state flat-panel display with excellent properties of low voltage driving, high-speed response, and a self-luminous property.

An organic EL display device includes thin-film transistors (TFTs) and organic EL elements connected to the TFTs on a substrate such as a glass substrate.

The organic EL elements are light-emitting elements capable of providing a high-luminance light when driven by low-voltage direct current, and each have a structure in which the first electrode, an organic EL layer, and the second electrode are laminated in the stated order. The first electrodes are connected to the TFTs. The organic EL layers each have a structure in which organic layers such as a hole injection layer, a hole transport layer, an electron blocking layer, a light-emitting layer, a hole blocking layer, an electron transport layer, and an electron injection layer are laminated.

A full-color organic EL display device typically includes organic EL elements in three colors of red (R), green (G), and blue (B), as the sub-pixels. The sub-pixels are aligned in a matrix on a substrate, and sub-pixels in these three colors constitute each pixel. The display device provides images by selectively allowing the organic EL elements to emit light with the desired luminance values, using the TFTs.

In production of such an organic EL display device, patterned light-emitting layers corresponding to sub-pixels are formed from organic light-emitting materials.

One method for forming the light-emitting layer by patterning having been developed recently utilizes a mask smaller than the substrate to carry out vapor deposition while moving the substrate relative to the mask and the vapor deposition source, so that organic EL elements are formed on the substrate that is larger than the mask (e.g. Patent Literatures 1, 2).

A technique related to such a method is an in-line film-forming apparatus which does not produce a mono-content film and can perform vapor co-deposition without causing density unevenness (e.g., Patent Literature 3).

Patent Literature 1: WO 2011/034011 A
Patent Literature 2: JP 2012-193391 A
Patent Literature 3: JP 2009-127066 A

SUMMARY OF THE INVENTION

FIG. 15 and FIG. 16 each are a schematic cross-sectional view of components during scanning vapor deposition (method of performing vapor deposition while moving (scanning) the substrate) studied by the present inventors. Here, each of FIG. 15 and FIG. 16 illustrates a cross section perpendicular to the scanning direction for the substrate.

As illustrated in FIG. 15, in the case of forming organic EL elements by scanning vapor deposition, a limiting plate 152, a mask 153, and a substrate 170 are arranged in the stated order over a nozzle 157 of a vapor deposition source. The substrate 170 is spaced from the mask 153 such that the substrate 170 is prevented from being damaged upon coming into contact with the mask 153 while being scanned. This arrangement tends to blur the outlines of a patterned thin film 171 to be formed on the substrate 170, causing the actual width W to be larger than the designed width w. The arrangement also tends to produce, at each side of a portion with a uniform film thickness, a portion with a gradually decreasing film thickness (hereinafter, also referred to as a blur portion).

The present inventors have then found that as the film-formation rate is raised, the width of the blur portion (hereinafter, also referred to as a blur width) increases as illustrated in FIG. 16. This increase is presumably due to a phenomenon in which the raised film-formation rate increases the density of the vapor deposition particles in the vicinity of the nozzle 157 from which vapor deposition streams are ejected, the vapor deposition particles with an increased density have a locally shortened mean free path, and thereby the size of the nozzle 157 virtually increases as illustrated by dashed lines in FIG. 16. Also, an increase in the blur width brings difficulties in production of a high-definition panel and a high-performance panel.

The technique described in Patent Literature 3 is also considered to cause the same problem when the film-formation rate is raised.

The present invention was made in view of the above state of the art, and aims to provide a method for producing an organic EL element capable of shortening the film-formation time while suppressing an increase in the blur width; and an organic EL display device.

One aspect of the present invention may be a method for producing an organic electroluminescent element, including a vapor deposition step of forming a patterned thin film by allowing vapor deposition particles to adhere to a substrate while moving the substrate relative to one or more vapor deposition sources, a limiting plate, and a mask, with the substrate being spaced from the mask, the one or more vapor deposition sources, the limiting plate, the mask, and the substrate being arranged in the stated order, the limiting plate being provided with openings, the one or more vapor deposition sources each being provided with ejection orifices that face the respective openings, the vapor deposition step including vapor deposition carried out under the condition of $r_i < R_i$, the ejection orifices facing the same opening being spaced from each other to give a sum of distributions represented by the following formula (1) of 1 or smaller, $$\cos^{(n_i+3)}\theta_i \times r_i / R_i \tag{1}$$

wherein $R_i$ represents a maximum film-formation rate of an ejection orifice i among the ejection orifices facing the same opening, i represents an integer of 1 or greater and m or smaller, m represents the number of the ejection orifices facing the same opening, $r_i$ represents the actual film-formation rate of the ejection orifice i in the vapor deposition step, $n_i$ is an n value, which is zero or more, of the ejection orifice i, and $\theta_i$ represents an angle formed by a main film formation direction and a segment connecting the ejection orifice i and a point within the film formation region.

Hereinafter, this method for producing an organic electroluminescent element is also referred to as the production method of the present invention.

Preferred modes of the production method of the present invention are described below. The following preferred modes may appropriately be combined with each other. A combination of two or more of the following preferred modes is also one preferred mode.

The ejection orifices facing the same opening may be arranged along the relative moving direction of the substrate.

The ejection orifices facing the same opening may be the same in the maximum film-formation rate, the actual film-formation rate, and the n value.

Here, being the same in the maximum film-formation rate means that the difference between the rates is 0.1 Å/sec or less. Being the same in the actual film-formation rate means that the difference between the rates is 0.1 Å/sec or less. Being the same in n value means that the difference between the values is 0.1 or less.

At least two of the ejection orifices facing the same opening may be different in at least one of the maximum film-formation rate, the actual film-formation rate, and the n value.

Here, being different in the maximum film-formation rate means that the difference between the rates is greater than 0.1 Å/sec. Being different in the actual film-formation rate means that the difference between the rates is greater than 0.1 Å/sec. Being different in the n value means that the difference between the values is greater than 0.1.

The relation of $D \leq A \times (T+L)/T$ may hold, wherein D represents the distance between two most distant ejection orifices among the ejection orifices facing the same opening, A represents the length of an opening of the mask in the relative moving direction of the substrate, T represents the thickness of the mask, and L represents the distance between the mask and each of the two ejection orifices.

Another aspect of the present invention may be an organic electroluminescent display device including an organic electroluminescent element produced by the production method of the present invention.

Yet another aspect of the present invention may be a vapor deposition apparatus including one or more vapor deposition sources; a limiting plate; and a mask, the vapor deposition apparatus carrying out vapor deposition by moving the substrate relative to the one or more vapor deposition sources, the limiting pate, and the mask, with the substrate being spaced from the mask, the one or more vapor deposition sources, the limiting plate, the mask, and the substrate being arranged in the stated order, the limiting plate being provided with openings, the one or more vapor deposition sources each being provided with ejection orifices that face the respective openings.

The present invention enables a method for producing an organic EL element capable of shortening the film formation time while suppressing an increase in the blur width; and an organic EL display device.

DETAILED DESCRIPTION OF THE INVENTION

Hereinafter, the present invention will be described in more detail with reference to the drawings based on embodiments which, however, are not intended to limit the scope of the present invention.

The following embodiments appropriately employ, for description, a Cartesian coordinate system in which the X axis and the Y axis exist in the horizontal plane and the Z axis extends in the vertical direction.

In the present embodiment, the method for producing organic EL elements for bottom-emission type devices in which light is emitted from the TFT substrate side and which provide RGB full-color display, and an organic EL display device including organic EL elements produced by the production method are mainly described. The present embodiment, however, is also applicable to methods for producing organic EL elements of the other types.

First, the structure of the entire organic EL display device of the present embodiment is described.

Figure 1:
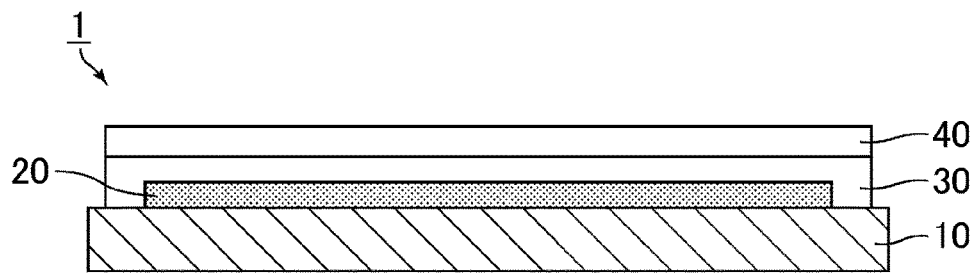
FIG. 1 is a schematic cross-sectional view of an organic EL display device including organic EL elements produced by the method for producing organic EL elements in Embodiment 1.
Figure 2:
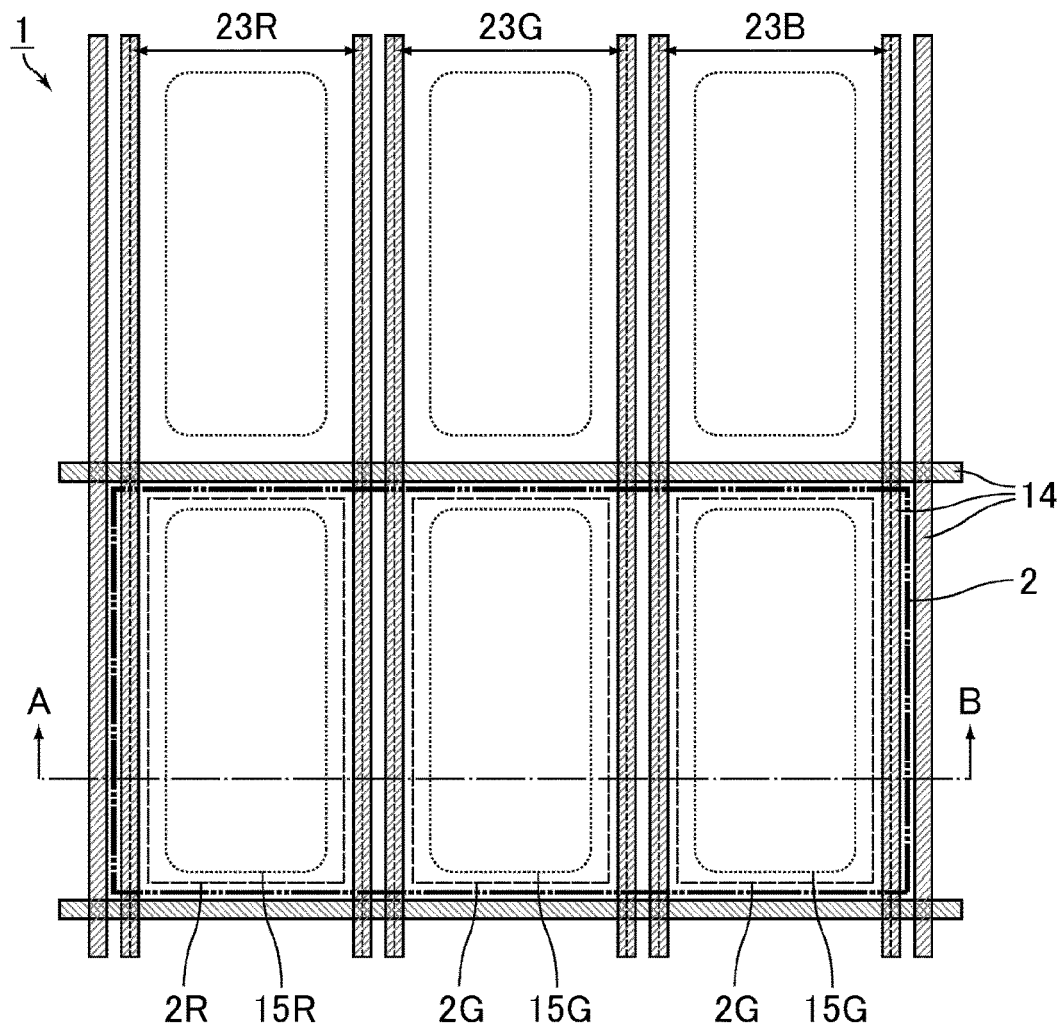
FIG. 2 is a schematic plan view of the structure in the display region of the organic EL display device illustrated in FIG. 1.
Figure 3:
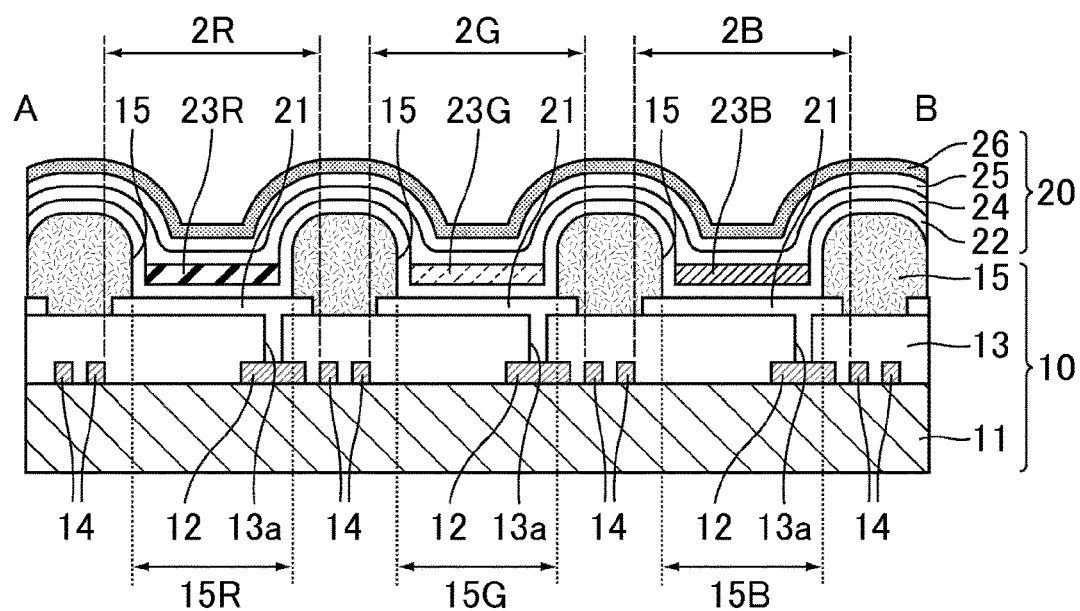
FIG. 3 is a schematic cross-sectional view of the structure of a TFT substrate in the organic EL display device illustrated in FIG. 1, and corresponds to the cross section taken along the A-B line in FIG. 2.

FIG. 1 is a schematic cross-sectional view of an organic EL display device including organic EL elements produced by the method for producing organic EL elements in Embodiment 1. FIG. 2 is a schematic plan view of the structure in the display region of the organic EL display device illustrated in FIG. 1. FIG. 3 is a schematic cross-sectional view of the structure of a TFT substrate in the organic EL display device illustrated in FIG. 1, and corresponds to the cross section taken along the A-B line in FIG. 2.

As illustrated in FIG. 1, an organic EL display device 1 of Embodiment 1 is provided with a TFT substrate 10 with TFTs 12 (cf. FIG. 3) formed thereon, organic EL elements 20 formed on the TFT substrate 10 and connected to the TFTs 12, an adhesive layer 30 covering the organic EL elements 20, and a sealing substrate 40 arranged on the adhesive layer 30.

When the sealing substrate 40 and the TFT substrate 10 with the organic EL elements 20 laminated thereon are attached by the adhesive layer 30, the organic EL elements 20 are sealed between the substrates 10 and 40 constituting one pair. Thereby, oxygen and moisture in the outside air are prevented from entering the organic EL elements 20.

As illustrated in FIG. 3, the TFT substrate 10 is provided with a transparent insulating substrate 11 such as a glass substrate as a supporting substrate. As illustrated in FIG. 2, conductive lines 14 are formed on the insulating substrate 11. The conductive lines 14 include gate lines provided in the horizontal direction, and signal lines that are provided in the vertical direction and intersect the gate lines. The gate lines are connected to a gate line driving circuit (not illustrated) which drives the gate lines. The signal lines are connected to a signal line driving circuit (not illustrated) which drives the signal lines.

The organic EL display device 1 is an active-matrix display device providing RGB full-color display, and each region defined by the conductive lines 14 includes a sub-pixel (dot) 2R, 2G, or 2B in a color red (R), green (G), or blue (B). The sub-pixels 2R, 2G, and 2B are arranged in a matrix. In each of the sub-pixels 2R, 2G, and 2B in the respective colors, an organic EL element 20 of the corresponding color and a light-emitting region are formed.

The red, green, and blue sub-pixels 2R, 2G, and 2B respectively emit red light, green light, and blue light, and each group of the three sub-pixels 2R, 2G, and 2B constitutes one pixel 2.

The sub-pixels 2R, 2G, and 2B are respectively provided with openings 15R, 15G, and 15B, and the openings 15R, 15G, and 15B are covered with red, green, and blue light-emitting layers 23R, 23G, and 23B, respectively. The light-emitting layers 23R, 23G, and 23B form stripes in the vertical direction. The patterned light-emitting layers 23R, 23G, and 23B are formed separately for one color at one time by vapor deposition. The openings 15R, 15G, and 15B are described later.

Each of the sub-pixels 2R, 2G, and 2B is provided with a TFT 12 connected to a first electrode 21 of the organic EL element 20. The luminescence intensity of each of the sub-pixels 2R, 2G, and 2B is determined based on scanning and selection using the conductive lines 14 and the TFTs 12. As described above, the organic EL display device 1 provides image display by selectively allowing the organic EL elements 20 in the individual colors to emit light, using the TFTs 12.

Next, the structures of the TFT substrate 10 and the organic EL elements 20 are described in detail. First, the TFT substrate 10 is described.

As illustrated in FIG. 3, the TFT substrate 10 is provided with the TFTs 12 (switching elements) and the conductive lines 14 which are formed on the insulating substrate 11; an interlayer film (interlayer insulating film, flattening film) 13 that covers the TFTs and conductive lines; and an edge cover 15 which is an insulating layer formed on the interlayer film 13.

The TFTs 12 are formed for the respective sub-pixels 2R, 2G, and 2B. Here, since the structure of the TFTs 12 may be a common structure, layers in the TFTs 12 are not illustrated or described.

The interlayer film 13 is formed on the insulating substrate 11 to cover the entire region of the insulating substrate 11. On the interlayer film 13, the first electrodes 21 of the organic EL elements 20 are formed. Also, the interlayer film 13 is provided with contact holes 13a for electrically connecting the first electrodes 21 to the TFTs 12. In this manner, the TFTs 12 are electrically connected to the organic EL elements 20 via the contact holes 13a.

The edge cover 15 is formed to prevent a short circuit between the first electrode 21 and a second electrode 26 of each organic EL element 20 when the organic EL layer is thin or concentration of electric fields occurs at the end of the first electrode 21. The edge cover 15 is therefore formed to partly cover the ends of the first electrodes 21.

The above-mentioned openings 15R, 15G, and 15B are formed in the edge cover 15. These openings 15R, 15G, and 15B of the edge cover 15 respectively serve as light-emitting regions of the sub-pixels 2R, 2G, and 2B. In other words, the sub-pixels 2R, 2G, and 2B are separated by the edge cover 15 which has insulation properties. The edge cover 15 functions also as an element-separation film.

Next, the organic EL element 20 is described.

The organic EL elements 20 are light-emitting elements capable of providing a high-luminance light when driven by low-voltage direct current, and each include the first electrode 21, the organic EL layer, and the second electrode 26 which are laminated in the stated order.

The first electrode 21 is a layer having a function of injecting (supplying) holes into the organic EL layer. The first electrode 21 is connected to the TFT 12 via the contact hole 13a as described above.

As illustrated in FIG. 3, the organic EL layer between the first electrode 21 and the second electrode 26 includes a hole injection/hole transport layer 22, the light-emitting layer 23R, 23G, or 23B, an electron transport layer 24, and an electron injection layer 25 in the stated order from the first electrode 21 side.

The above lamination order is for the case that the first electrode 21 is an anode and the second electrode 26 is a cathode. In the case that the first electrode 21 is a cathode and the second electrode 26 is an anode, the lamination order for the organic EL layer is reversed.

The hole injection layer has a function of increasing the hole injection efficiency to the light-emitting layer 23R, 23G, or 23B. The hole transport layer has a function of increasing the hole transport efficiency to the light-emitting layer 23R, 23G, or 23B. The hole injection/hole transport layer 22 is uniformly formed on the entire display region of the TFT substrate 10 to cover the first electrodes 21 and the edge cover 15.

The present embodiment is described based on an example in which an integrated form of a hole injection layer and a hole transport layer, namely the hole injection/hole transport layer 22, is provided as the hole injection layer and the hole transport layer. The present embodiment, however, is not particularly limited to this example. The hole injection layer and the hole transport layer may be formed as layers independent of each other.

On the hole injection/hole transport layer 22, the light-emitting layers 23R, 23G, and 23B are formed corresponding to, respectively, sub-pixels 2R, 2G, and 2B, to cover the openings 15R, 15G, and 15B of the edge cover 15.

Each of the light-emitting layers 23R, 23G, and 23B has a function of emitting light by recombining holes injected from the first electrode 21 side and electrons injected from the second electrode 26 side. Each of the light-emitting layers 23R, 23G, and 23B is formed from a material exhibiting a high light-emitting efficiency, such as a low-molecular fluorescent dye and a metal complex.

The electron transport layer 24 has a function of increasing the electron transport efficiency from the second electrode 26 to each of the light-emitting layers 23R, 23G, and 23B. The electron injection layer 25 has a function of increasing the electron injection efficiency from the second electrode 26 to each of the light-emitting layers 23R, 23G, and 23B.

The electron transport layer 24 is uniformly formed on the entire display region of the TFT substrate 10 to cover the light-emitting layers 23R, 23G, and 23B, and the hole injection/hole transport layer 22. Also, the electron injection layer 25 is uniformly formed on the entire display region of the TFT substrate 10 to cover the electron transport layer 24.

The electron transport layer 24 and the electron injection layer 25 may be formed as layers independent of each other, or may be formed as an integrated layer. That is, the organic EL display device 1 may be provided with an electron transport/electron injection layer in place of the electron transport layer 24 and the electron injection layer 25.

The second electrode 26 has a function of injecting electrons to the organic EL layer. The second electrode 26 is uniformly formed on the entire display region of the TFT substrate 10 to cover the electron injection layer 25.

Here, organic layers other than the light-emitting layers 23R, 23G, and 23B are not essential layers for the organic EL layer, and may be appropriately formed depending on the required properties of the organic EL elements 20. The organic EL layer may additionally include a carrier blocking layer. For example, a hole blocking layer may be added as a carrier blocking layer between the light-emitting layer 23R, 23G, or 23B and the electron transport layer 24 such that holes can be prevented from reaching the electron transport layer 24, and thereby the light-emitting efficiency is enhanced.

The structure of the organic EL elements 20 may be any of the following structures (1) to (8).

(1) First electrode/light-emitting layer/second electrode (2) First electrode/hole transport layer/light-emitting layer/electron transport layer/second electrode (3) First electrode/hole transport layer/light-emitting layer/hole blocking layer/electron transport layer/second electrode (4) First electrode/hole transport layer/light-emitting layer/hole blocking layer/electron transport layer/electron injection layer/second electrode (5) First electrode/hole injection layer/hole transport layer/light-emitting layer/electron transport layer/electron injection layer/second electrode (6) First electrode/hole injection layer/hole transport layer/light-emitting layer/hole blocking layer/electron transport layer/second electrode (7) First electrode/hole injection layer/hole transport layer/light-emitting layer/hole blocking layer/electron transport layer/electron injection layer/second electrode (8) First electrode/hole injection layer/hole transport layer/electron blocking layer (carrier blocking layer)/light-emitting layer/hole blocking layer/electron transport layer/electron injection layer/second electrode The hole injection layer and the hole transport layer may be integrated as described above. Also, the electron transport layer and the electron injection layer may be integrated.

The structure of the organic EL elements 20 is not limited to the structures (1) to (8), and any desired layer structure can be used depending on the required properties of the organic EL elements 20.

Next, the method for producing the organic EL display device 1 is described.

Figure 4:
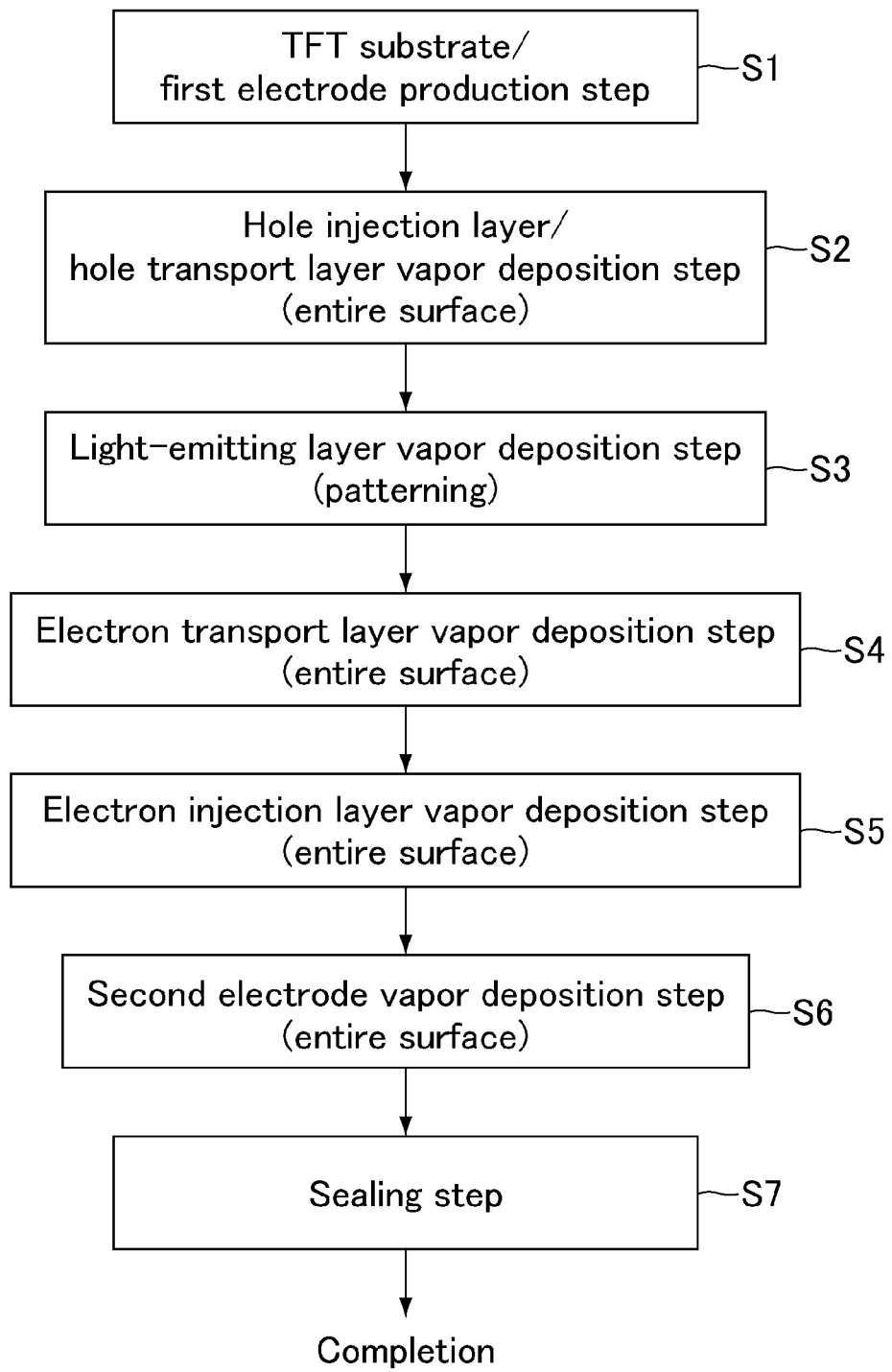
FIG. 4 is a flowchart for describing the production steps of the organic EL display device of Embodiment 1.

FIG. 4 is a flowchart for describing the production steps of the organic EL display device of Embodiment 1.

As illustrated in FIG. 4, the method for producing an organic EL display device according to the present embodiment includes, for example, a TFT substrate/first electrode production step S1, a hole injection layer/hole transport layer vapor deposition step S2, a light-emitting layer vapor deposition step S3, an electron transport layer vapor deposition step S4, an electron injection layer vapor deposition step S5, a second electrode vapor deposition step S6, and a sealing step S7.

Hereinafter, the production steps of the components described above with reference to FIGS. 1 to 3 are described by following the flowchart shown in FIG. 4. The size, material, shape, and the other designs of each component described in the present embodiment are merely examples which are not intended to limit the scope of the present invention.

As described above, the lamination order described in the present embodiment is for the case that the first electrode 21 is an anode and the second electrode 26 is a cathode. In the case that the first electrode 21 is a cathode and the second electrode 26 is an anode, the lamination order for the organic EL layer is reversed. Similarly, the materials of the first electrode 21 and the second electrode 26 are changed to the corresponding materials.

First, as illustrated in FIG. 3, a photosensitive resin is applied by a common method to the insulating substrate 11 on which components such as the TFTs 12 and the conductive lines 14 are formed, and the photosensitive resin is patterned by photolithography, so that an interlayer film 13 is formed on the insulating substrate 11.

The insulating substrate 11 may be, for example, a glass substrate or a plastic substrate with a thickness of 0.7 to 1.1 mm, a Y-axial direction length (vertical length) of 400 to 500 mm, and an X-axis direction length (horizontal length) of 300 to 400 mm.

The material of the interlayer film 13 can be, for example, a resin such as an acrylic resin and a polyimide resin. Examples of the acrylic resin include the OPTMER series from JSR Corporation. Examples of the polyimide resin include the PHOTONEECE series from Toray Industries, Inc. The polyimide resin, however, is typically colored, not transparent. For this reason, in the case of producing a bottom-emission organic EL display device as the organic EL display device 1 as illustrated in FIG. 3, a transparent resin such as an acrylic resin is more suitable for the interlayer film 13.

The thickness of the interlayer film 13 may be any value that can compensate for the steps formed by the TFTs 12. For example, the thickness may be about 2 μm.

Next, the contact holes 13*a* for electrically connecting the first electrodes 21 to the TFTs 12 are formed in the interlayer film 13.

A conductive film (electrode film), for example an indium tin oxide (ITO) film, is formed to a thickness of 100 nm by sputtering or the like method.

A photoresist is applied to the ITO film, and the photoresist is patterned by photolithography. Then, the ITO film is etched with ferric chloride as an etching solution. The photoresist is removed by a resist removing solution, and the substrate is washed. Thereby, the first electrodes 21 are formed in a matrix on the interlayer film 13.

The conductive film material used for the first electrodes 21 may be, for example, a transparent conductive material such as ITO, indium zinc oxide (IZO), and gallium-added zinc oxide (GZO); or a metal material such as gold (Au), nickel (Ni), and platinum (Pt).

The lamination method for the conductive film other than sputtering may be vacuum vapor deposition, chemical vapor deposition (CVD), plasma CVD, or printing.

The thickness of each first electrode 21 is not particularly limited, and may be 100 nm as described above, for example.

The edge cover 15 is then formed to a thickness of about 1 μm, for example, by the same method as that for the interlayer film 13. The material of the edge cover 15 can be the same insulating material as that for the interlayer film 13.

By the above procedure, the TFT substrate 10 and the first electrodes 21 are produced (S1).

Next, the TFT substrate 10 obtained in the above step is subjected to the reduced-pressure baking for dehydration, and to oxygen plasma treatment for surface washing of the first electrodes 21.

With a typical vapor deposition apparatus, a hole injection layer and a hole transport layer (hole injection/hole transport layer 22 in the present embodiment) are deposited on the entire display region of the TFT substrate 10 (S2).

Specifically, an open mask which is open to the entire display region is subjected to alignment control relative to the TFT substrate 10, and the open mask is attached closely to the TFT substrate 10. The vapor deposition particles dispersed from the vapor deposition source are then evenly deposited on the entire display region via the opening of the open mask, while both the TFT substrate 10 and the open mask are rotated.

Here, the vapor deposition to the entire display region means continuous vapor deposition over sub-pixels which are in different colors from the adjacent sub-pixels.

Examples of the material for the hole injection layer and the hole transport layer include benzine, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, and derivatives thereof; polysilane-based compounds; vinylcarbazole-based compounds; and conjugated heterocyclic monomers, oligomers, or polymers, such as thiophene-based compounds and aniline-based compounds.

The hole injection layer and the hole transport layer may be integrated as described above, or may be formed as layers independent of each other. The thickness of each layer is, for example, 10 to 100 nm.

In the case of forming the hole injection/hole transport layer 22 as the hole injection layer and the hole transport layer, the material of the hole injection/hole transport layer 22 may be, for example, 4,4'-bis[N-(1-naphthyl)-N-phenylamino]biphenyl (α-NPD). The thickness of the hole injection/hole transport layer 22 may be, for example, 30 nm.

On the hole injection/hole transport layer 22, the light-emitting layers 23R, 23G, and 23B are separately formed (by patterning) to correspond to the sub-pixels 2R, 2G, and 2B, and cover the openings 15R, 15G, and 15B of the edge cover 15, respectively (S3).

As described above, a material with a high light-emitting efficiency, such as a low-molecular fluorescent dye or a metal complex, is used for each of the light-emitting layers 23R, 23G, and 23B.

Examples of the material of the light-emitting layers 23R, 23G, and 23B include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, and derivatives thereof; a tris(8-quinolinolato)aluminum complex; a bis(benzoquinolinolato)beryllium complex; a tri(dibenzoylmethyl)phenanthroline europium complex; and ditolylvinyl biphenyl.

The thickness of each of the light-emitting layers 23R, 23G, and 23B is 10 to 100 nm, for example.

The production method of the present invention is especially suitable for formation of such light-emitting layers 23R, 23G, and 23B.

The method for forming the patterned light-emitting layers 23R, 23G, and 23B using the production method of the present invention is described later in detail.

By the same method as that in the hole injection/hole transport layer vapor deposition step S2, the electron transport layer 24 is deposited on the entire display region of the TFT substrate 10 to cover the hole injection/hole transport layer 22 and the light-emitting layers 23R, 23G, and 23B (S4).

By the same method as that in the hole injection/hole transport layer vapor deposition step S2, the electron injection layer 25 is deposited on the entire display region of the TFT substrate 10 to cover the electron transport layer 24 (S5).

Examples of the material of the electron transport layer 24 and the electron injection layer 25 include quinoline, perylene, phenanthroline, bisstyryl, pyrazine, triazole, oxazol, oxadiazole, fluorenone, and derivatives thereof and metal complexes thereof; and lithium fluoride (LiF).

Specific examples thereof include Alq3 (tris(8-hydroxyquinoline)aluminum), anthracene, naphthalene, phenanthrene, pyrene, anthracene, perylene, butadiene, coumarin, acridine, stilbene, 1,10-phenanthroline, and derivatives thereof and metal complexes thereof; and LiF.

As described above, the electron transport layer 24 and the electron injection layer 25 may be integrated or may be formed as independent layers. The thickness of each layer is 1 to 100 nm, for example, and is preferably 10 to 100 nm. Also, the total thickness of the electron transport layer 24 and the electron injection layer 25 is 20 to 200 nm, for example.

Typically, Alq3 is used as the material of the electron transport layer 24, and LiF is used as the material of the electron injection layer 25. For example, the thickness of the electron transport layer 24 is 30 nm, and the thickness of the electron injection layer 25 is 1 nm.

By the same method as that in the hole injection/hole transport layer vapor deposition step (S2), the second electrode 26 is deposited on the entire display region of the TFT substrate 10 to cover the electron injection layer 25 (S6). As a result, the organic EL elements 20 each including the organic EL layer, the first electrode 21, and the second electrode 26 are formed on the TFT substrate 10.

For the material (electrode material) of the second electrode 26, a material such as a metal with a small work function is suitable. Examples of such an electrode material include magnesium alloys (e.g. MgAg), aluminum alloys (e.g. AlLi, AlCa, AlMg), and metal calcium. The thickness of the second electrode 26 is 50 to 100 nm, for example.

Typically, the second electrode 26 is formed from a 50-nm-thick aluminum thin film.

Subsequently, as illustrated in FIG. 1, the TFT substrate 10 with the organic EL elements 20 formed thereon and the sealing substrate 40 are attached by the adhesive layer 30, so that the organic EL elements 20 are sealed.

The sealing substrate 40 is, for example, an insulating substrate (e.g. glass substrate or plastic substrate) with a thickness of 0.4 to 1.1 mm.

Here, the vertical length and the horizontal length of the sealing substrate 40 may be appropriately adjusted to suit the size of the subject organic EL display device 1. The organic EL elements 20 may be sealed using an insulating substrate of substantially the same size as that of the insulating substrate 11 of the TFT substrate 10, and these substrates may be cut according to the size of the subject organic EL display device 1.

Also, the method for sealing the organic EL elements 20 is not particularly limited to the above method, and may be any other sealing method. Examples of the other sealing method include a method of sealing the elements using an engraved glass plate used as the sealing substrate 40 by a material such as a sealing resin or a glass frit applied in a frame-like shape; and a method of filling the space between the TFT substrate 10 and the sealing substrate 40 with a resin.

Also, on the second electrode 26, a protective film (not illustrated) may be provided to prevent oxygen and moisture in the outside air from entering the organic EL elements 20.

The protective film can be formed from an insulating or conductive material. Examples of such a material include silicon nitride and silicon oxide. The thickness of the protective film is 100 to 1000 nm, for example.

These steps produce the organic EL display device 1.

In this organic EL display device 1, holes are injected by the first electrodes 21 into the organic EL layer when the TFTs 12 are turned on by signals input through the conductive lines 14. Meanwhile, electrons are injected by the second electrode 26 into the organic EL layer, and the holes and electrons are recombined in each of the light-emitting layers 23R, 23G, and 23B. The energy from the recombination of the holes and electrons excites the light-emitting materials, and when the excited materials go back to the ground state, light is emitted. Controlling the luminance of the light emitted from each of the sub-pixels 2R, 2G, and 2B enables display of a predetermined image.

Next, the light-emitting layer vapor deposition step S3 is described. The light-emitting layer vapor deposition step S3 corresponds to the vapor deposition step in the production method of the present invention.

Figure 5:
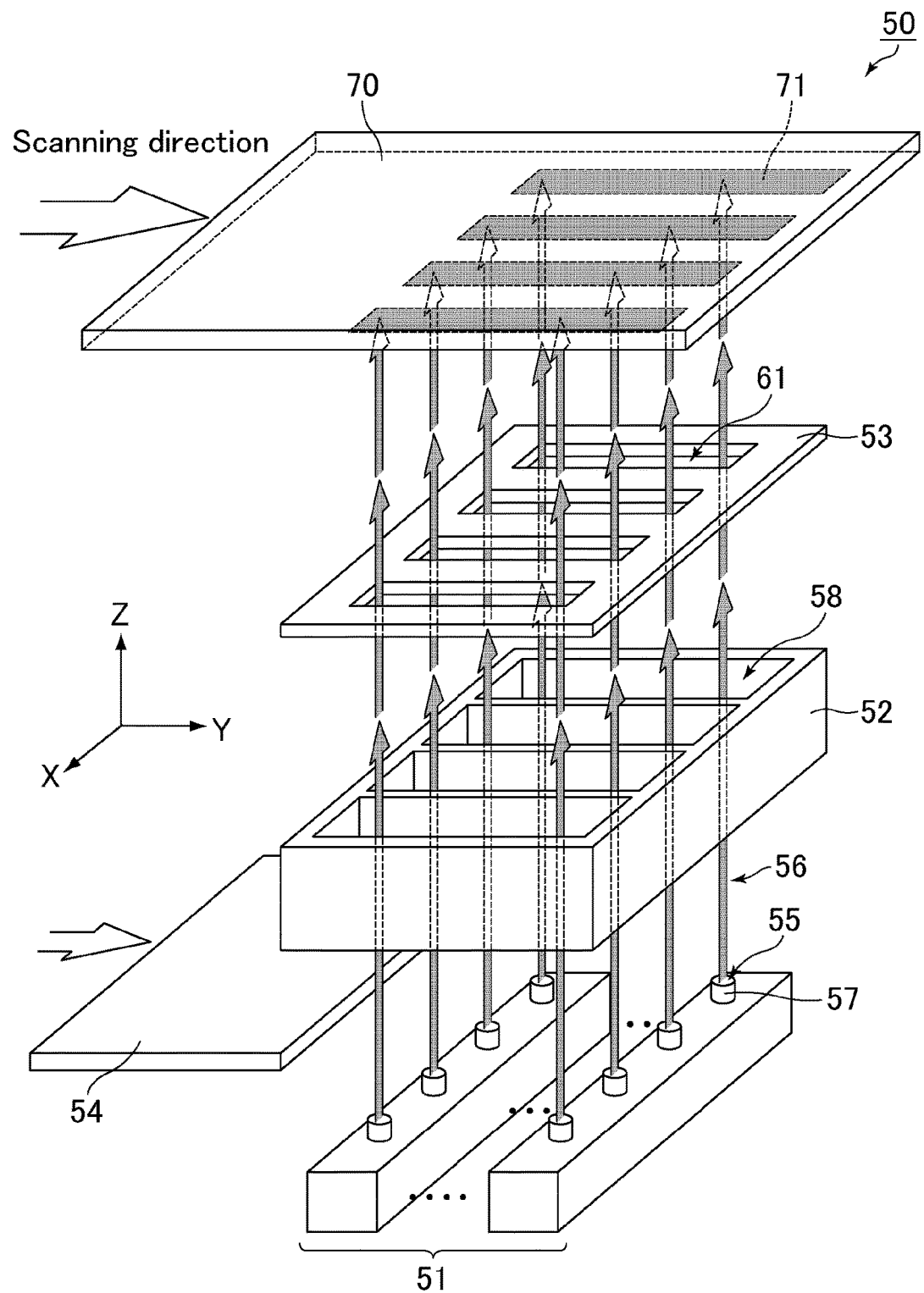
FIG. 5 is a schematic perspective view of components in the light-emitting layer vapor deposition step in Embodiment 1.
Figure 6:
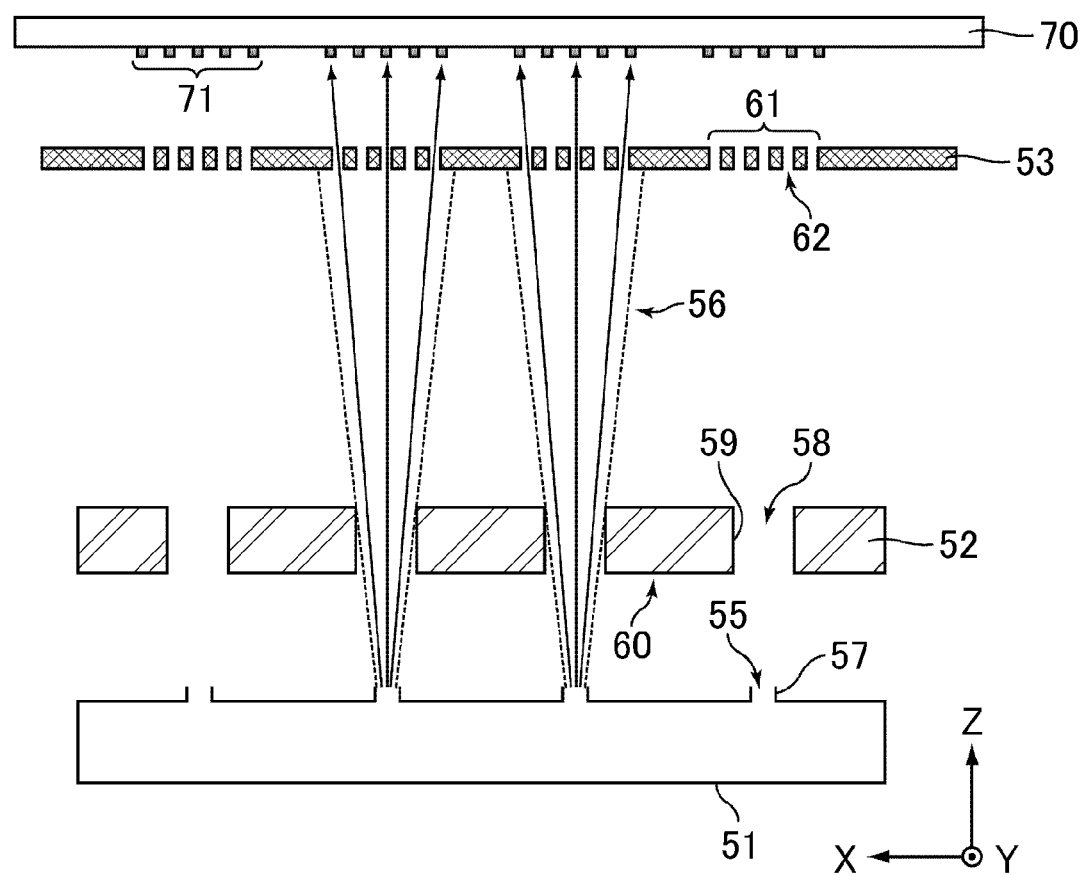
FIG. 6 is a schematic cross-sectional view of components in the light-emitting layer vapor deposition step in Embodiment 1.

FIG. 5 is a schematic perspective view of components in the light-emitting layer vapor deposition step in Embodiment 1. FIG. 6 is a schematic cross-sectional view of components in the light-emitting layer vapor deposition step in Embodiment 1. FIG. 6 illustrates the cross section perpendicular to the scanning direction of the substrate, i.e., the XZ plane.

As illustrated in FIG. 5 and FIG. 6, the light-emitting layer vapor deposition step S3 is performed using a vapor deposition apparatus 50. The vapor deposition apparatus 50 is provided with a vacuum chamber (not illustrated) and a vacuum pump (not illustrated) connected to the vacuum chamber. The vapor deposition apparatus 50 includes vapor deposition sources 51, a limiting plate 52 arranged above the vapor deposition sources 51, a mask (vapor deposition mask) 53 arranged above the limiting plate 52, a shutter 54, a substrate-holding system (not illustrated) configured to hold the substrate (film-formation target substrate) 70, a substrate-moving system (not illustrated) configured to move the substrate 70 in the XY plane, i.e., in the horizontal direction, and an alignment system (not illustrated) in the vacuum chamber.

The vapor deposition sources 51, the limiting plate 52, and the mask 53 are integrated into one unit. The substrate-holding system can be an electrostatic chuck, for example, and the substrate-moving system includes a drive motor, for example. The alignment system is configured to control the position of the substrate 70 relative to the unit including components such as the vapor deposition sources 51, and includes, for example, a position detection device such as a CCD camera, and a control circuit connected to the position detection device.

The substrate 70 corresponds to the substrate in the production method of the present invention. The substrate 70 is produced through the TFT substrate/first electrode production step S1 and the hole injection/hole transport layer vapor deposition step S2, and is provided with the TFTs 12, the conductive lines 14, the interlayer film 13, the first electrodes 21, the edge cover 15, and the hole injection/hole transport layer 22 formed on the insulating substrate 11 as described above.

In the Y-axis direction, m (an integer of 2 or greater) number of the vapor deposition sources 51 are placed. The vapor deposition sources 51 each are a container which accommodates a vapor deposition material inside, and have a heating tool (not illustrated) which heats the vapor deposition material. The portion of each vapor deposition source 51 facing the limiting plate 52, that is, the upper portion, is provided with sets of k (integer of 2 or greater) number of the ejection orifices 55, which are open, periodically in the X-axis direction. Therefore, k number of the ejection orifices 55 are arranged in the X-axis direction, and m number of them are arranged in the Y-axis direction, which means that (k×m) number of them in total are arranged. Here, the upper limits for the k and m are not particularly limited, and may be appropriately set. The vapor deposition material turns into vapor when heated by the heating tool, and the vapor is diffused within the vapor deposition source 51 to be ejected from the ejection orifice 55 upwardly. As a result, a vapor deposition stream 56, which is a stream of vapor deposition particles, is generated from each ejection orifice 55.

The planar shape of each ejection orifice 55 is not particularly limited, and can be appropriately set. Examples of the planar shape include a circle, an oval, and a rectangle. Preferred is a circle. Since a circular planar shape enables isotropic ejection of the vapor deposition stream 51 from each ejection orifice 55, the film thickness distribution of the thin film to be formed in the scanning direction of the substrate 70 is the same as that in the direction perpendicular to the scanning direction. Therefore, the vapor deposition apparatus 50 can be easily designed. In contrast, when the planar shape of each ejection orifice 55 is designed to be an oval or a rectangle and each ejection orifice 55 is positioned with its longitudinal direction being parallel to the scanning direction of the substrate 70, dispersion of the deposition particles of adjacent vapor deposition streams 56 in the scanning direction of the substrate 70 may be large. Also, when the planar shape of each ejection orifice 55 is designed to be an oval or a rectangle and each ejection orifice 55 is positioned with its longitudinal direction being parallel to the direction perpendicular to the scanning direction of the substrate 70, the blur width of the patterned thin film tends to be large.

Typical examples of the planar shape of each ejection orifices 55 include a rectangle with a width in the X-axis direction of 4 mm and a width in the Y-axis direction of 50 mm, and a circle with a diameter of 2 mm or 4 mm. The planar shapes of the ejection orifices 55 can be designed independently of each other, but every ejection orifice 55 is usually designed to have the same planar shape.

The size (area) of each ejection orifice 55 is not particularly limited either, and can be appropriately set, but is preferably 0.1 mm$^2$ to 1000 mm$^2$. A size of less than 0.1 mm$^2$ may cause clogging in the ejection orifice 55 with the vapor deposition material. A size of larger than 1000 mm$^2$ may increase the diffusion of the vapor deposition particles, which may significantly decrease the utilization efficiency of the vapor deposition material. Since the vapor deposition material for the organic EL elements is expensive, a significant decrease in the utilization efficiency of the vapor deposition material causes a decrease in the productivity. The sizes (areas) of the ejection orifices 55 can be designed independently of each other, but every ejection orifice 55 is usually designed to have the same size.

As illustrated in FIG. 5 and FIG. 6, the ejection orifices 55 may be formed at the ends of the nozzles 57 on the top of the vapor deposition source 51.

The limiting plate 52 is a component to remove unnecessary substances (vapor deposition particles) from the vapor deposition streams 56 ejected from the ejection orifices 55. In the limiting plate 52, k number of openings 58 are formed at substantially the same pitch as the pitch for the ejection orifices 55 in the X-axis direction. Below each opening 58, m number of ejection orifices 55 are located, so that the vapor deposition streams 56 rise up to each opening 58. Some of the vapor deposition particles contained in each vapor deposition stream 56 can pass through the corresponding opening 58, but the rest of the particles adhere to the wall 59 or the base 60 of the limiting plate 52, failing to pass through the opening 58. Also, the limiting plate 52 prevents the vapor deposition streams 56 from passing through the opening 58 next to the corresponding opening 58. The limiting plate 52 can suppress unnecessary increase in the incident angle of each vapor deposition stream 56 to the substrate 70. Thereby, the size of the blur width of the transferred pattern can be controlled. Also, since m number of ejection orifices 55, i.e., a plurality of ejection orifices 55, are arranged for each opening 58, the film-formation rate can be increased compared to the case of arranging one ejection orifice for each opening. The m number of ejection orifices 55 facing the same opening 58 are provided on the same straight line parallel to the relative moving direction of the substrate 70, i.e., the Y-axis direction.

The mask 53 includes opening groups 61 at substantially the same pitch as the pitch in the X-axis direction of the openings 58. For each opening 58, one opening group 61 is provided. Each opening group 61 is arranged to face the corresponding opening 58 and the m number of ejection orifices 57 below the opening 58. Each opening group 61 includes striped (slit-like) openings 62. Each opening 62 is formed into a shape which is long in the Y-axis direction and short in the X-axis direction (e.g. rectangle). Each opening 62 is arranged substantially in parallel with the Y-axis direction. Some of the vapor deposition streams 56 having traveled to the mask 53 pass through the openings 62 to reach the substrate 70, and the rest of the particles are blocked by the mask 53. Hence, the vapor deposition particles are deposited on the substrate 70 in a pattern corresponding to the openings 62 of the mask 53.

The mask 53 is smaller than the substrate 70, and at least one side of the mask 53 is shorter than the corresponding side of the vapor deposition region in the substrate 70. Thereby, the mask 53 can be easily produced, and the mask 53 is prevented from being deflected due to the weight thereof. In order to prevent the substrate 70 from being damaged during scanning of the substrate 70, the mask 53 is spaced from the substrate 70, i.e., is arranged apart from the substrate 70, and a space (gap) of a predetermined size is provided between the mask 53 and the substrate 70. This gap is preferably 0.05 mm or larger but 5 mm or smaller. If this gap is too wide, the blur width of the patterned thin film is large. A value larger than 5 mm is therefore not practical. A smaller gap is preferred, but if the space between the mask 53 and the substrate 70 is too small, the mask 53 and the substrate 70 may come into contact with each other during vapor deposition, due to the factors such as vibration of the substrate 70 in scanning, the irregular surface of the substrate 70, and distortion of the mask 53. Therefore, a value smaller than 0.05 mm is not practical.

During vapor deposition, the space between the mask 53 and the surface on which each ejection orifice 55 is formed is kept at a predetermined distance. The space is preferably 50 mm or larger and 2000 mm or smaller. If the space is too small, the blur width tends to be too large. Hence, a value smaller than 50 mm is not practical. Also, since between the mask 53 and the ejection orifices 55, the shutter 54 for blocking the vapor deposition streams 56 and the limiting plate 52 for limiting (controlling) the traveling range of the vapor deposition particles are arranged, a value smaller than 50 mm is not practical also from the viewpoint of the structure of the vapor deposition apparatus 50. A value of larger than 2000 mm is not practical either because the distance between the ejection orifices 55 and the mask 53 and the distance between the ejection orifices 55 and the substrate 70 both are too long, and the utilization efficiency of the vapor deposition material tends to be too low.

In the light-emitting layer vapor deposition step S3, vapor deposition is performed three times to form the light-emitting layers 23R, 23G, and 23B in three colors in order.

At each time of vapor deposition, the vapor deposition particles are allowed to adhere to the substrate 70 while the substrate 70 is moved (scanned) relative to the unit including components such as the vapor deposition sources 51, so that a stripe-patterned thin film 71 is formed as the light-emitting layer 23R, 23G or 23B.

During vapor deposition, the substrate 70 is scanned in the Y-axis direction. Since the vapor deposition sources 51, the limiting plate 52, and the mask 53 are integrated, the positional relation between them is always fixed. Here, both of the substrate 70 and the unit including components such as the vapor deposition sources 51 may be moved, or the unit may be moved while the substrate 70 is fixed. The thickness of the film can be appropriately changed by changing the speed of scanning or the number of times of scanning. The atmospheric pressure within the vacuum chamber during the vapor deposition is set to about $1 \times 10^{-5}$ to $1 \times 10^{-1}$ Pa.

The shutter 54 is provided to be insertable between the vapor deposition sources 51 and the limiting plate 52. The shutter 54, when inserted between these components, closes the openings 58 of the limiting plate 52. In this manner, with the shutter 54 appropriately inserted between the vapor deposition sources 51 and the limiting plate 52, vapor deposition on unnecessary portions (non-vapor-deposition regions) can be prevented.

From the viewpoint of shortening the film formation time, it is preferable to raise the film-formation rate of each ejection orifice 55 to increase the density of the vapor deposition particles in each vapor deposition stream 56. However, if the density is made too high, a problem of an increase in the blur width arises as described above. Accordingly, in the present embodiment, from the viewpoint of achieving both shortening of the film formation time and prevention of an increase in the blur width, the arrangement position of each ejection orifice 55 is determined and the film-formation rate of each ejection orifice 55 is controlled. Hereinafter, the methods thereof are described in detail.

First, for each ejection orifice 55, an n value is calculated. Generally, the thickness of a thin film formed by vacuum vapor deposition is known to exhibit a distribution by what is called a law of cosine to the $n^{th}$ power. That is, if the segment connecting an ejection orifice (usually the center of the orifice) and one point within the region (film-formation region) in which a thin-film is to be formed by the vapor deposition stream from each ejection orifice is supposed to form an angle of θ with the main film-formation direction, the film-thickness distribution of the thin film to be formed is represented by $\cos^{(n+3)} \theta$. Here, the n (n value) is a number of zero or larger, and is specific to the ejection orifice. Also, the main film-formation direction is the direction from the ejection orifice (usually the center thereof) toward the point at which the film thickness is the largest.

Specifically, a vapor deposition stream is generated from each ejection orifice 55, and vapor deposition particles are deposited on a test substrate (glass substrate), so that thin films are formed. At this time, each test substrate is fixed, and no mask 53 is arranged. Hence, the resulting thin film is not patterned. The film-thickness distribution of each thin film in a certain direction (e.g. Y-axis direction) is measured, and is fitted to the graph of $\cos^{(n+3)} \theta$ with various n values, whereby the n value of each ejection orifice 55 is calculated.

Next, the maximum film-formation rate R of each ejection orifice 55 is determined. Specifically, at multiple film-formation rates, a vapor deposition stream is generated from each ejection orifice 55, to deposit the vapor deposition particles on a test substrate (e.g. glass substrate) via the mask 53, so that multiple patterned thin films are formed. In other words, patterned thin films are formed under the same conditions as those for the light-emitting layer vapor deposition step S3, except that the patterned thin films are separately formed by the respective ejection orifices 55 at various film-formation rates. In the direction perpendicular to the scanning direction of the substrate 70, i.e., in the X-axis direction, the film-thickness distribution (cross-sectional shape) of each of the patterned thin films formed is measured. The distribution is compared to the designed film-thickness distribution (cross-sectional shape) of the patterned thin film. Thereby, the blur amount is calculated. Hereinafter, the method for calculating the blur amount is described using FIG. 7.

Figure 7:
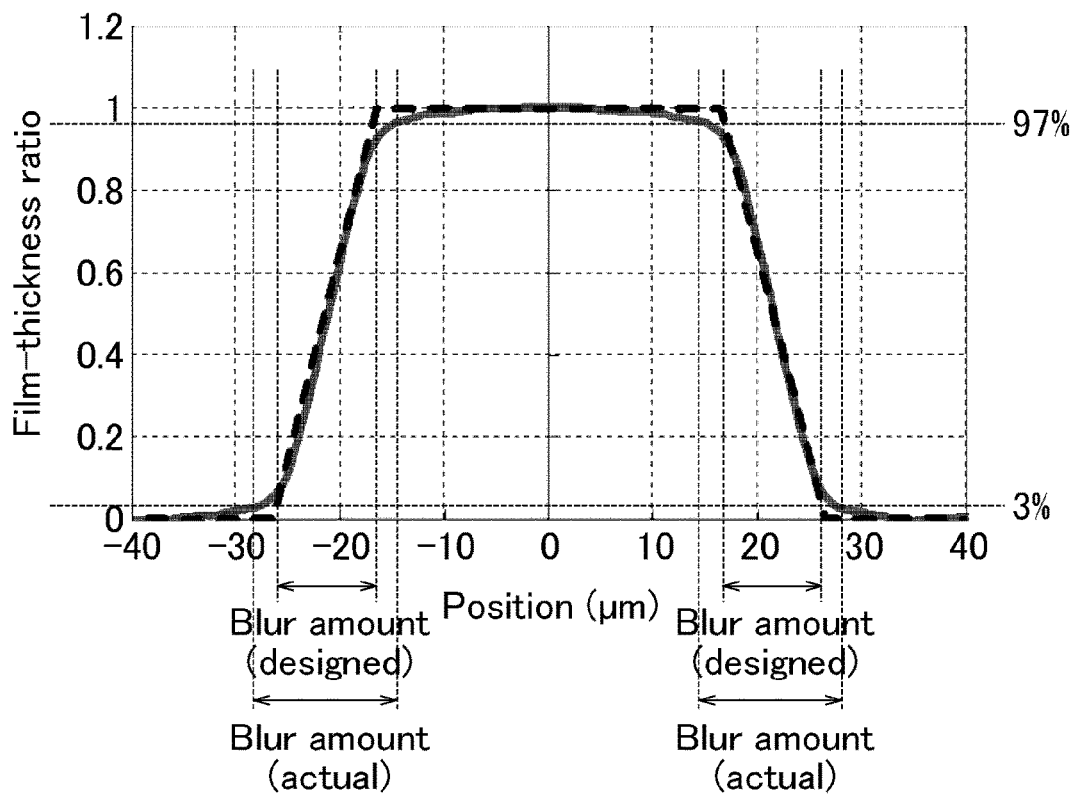
FIG. 7 shows film thickness distributions in the X-axis direction of the actually patterned thin film and the designed pattern for the actually patterned thin film.

FIG. 7 shows film thickness distributions in the X-axis direction of the actually patterned thin film and the designed pattern of the actually patterned thin film.

In FIG. 7, the actual thickness distribution is indicated by a solid line, and the designed thickness distribution is indicated by a dashed line. The actual thickness distribution can be measured with a step height meter. The step height meter can be, for example, TENCOR P-11 from KLA-Tencor. Each thickness distribution is standardized with the maximum film thickness of 1. The designed film-thickness distribution is determined based on geometric conditions such as the shape of the ejection orifice 55, the shape of the openings of the mask 53, and various positional relations of the components. Here, a width giving a film thickness of 3% to 97% of the maximum film thickness (100%) is defined as a blur amount. As illustrated in FIG. 7, the actual cross-sectional shape is round compared to the designed cross-sectional shape, and the blur amount in the actual film-thickness distribution is larger than the blur amount in the designed film-thickness distribution. The range within which the blur amount in the actual film-thickness distribution is not more than 1.3 times the blur amount of the designed film-thickness distribution was taken as the acceptable range, and the maximum film-formation rate within the acceptable range is taken as the maximum film-formation rate R.

In the definition of the blur amount, the lower limit for the film thickness is set to 3% because a thickness smaller than 3% increases the risk of measurement errors. Also, the upper limit for the film thickness was set to 97% in the definition of the blur amount in order to eliminate the influence of an in-plane variation of about 3% in the actual film-thickness distribution. The acceptable range of the blur amount was defined as 1.3 times or less because a blur amount more than that widens the ineffective region (non-light-emitting region) in the display region.

Herein, the film-formation rate is represented as the film thickness of a thin film formed per unit time, and the unit thereof is Å/second (sec), for example. The film-formation rate is measured at a point where the film thickness of the thin film to be formed is at the maximum.

As to the ejection orifices 55 having substantially the same planar shape and size, the n value and the maximum film-formation rate of only one of the ejection orifices may be measured, and the values can be used as the n value and maximum film-formation rate of the other ejection orifices 55. This is because ejection orifices with the same planar shape and size are considered to have substantially the same n value and maximum film-formation rate.

Based on the above results, the film-formation rate of each ejection orifice 55 is controlled such that vapor deposition is performed under the conditions of $r_i < R_i$ in the light-emitting layer vapor deposition step S3. Here, $R_i$ represents the maximum film-formation rate of an ejection orifice i (integer of 1 or greater and m or smaller) among the m number of the ejection orifices 55 facing the same opening 58, and $r_i$ represents the actual film-formation rate of the ejection orifice i in the light-emitting layer vapor deposition step S3. That is, the actual film-formation rate r is controlled not to exceed the maximum film-formation rate R in each ejection orifice 55. Thereby, an increase in the blur amount, which is probably due to an increase in the density of the vapor deposition particles in the vicinity of the ejection orifices 55 as described above, can be suppressed.

Still, even when the increase in the blur width due to an increase in the density of vapor deposition particles can be suppressed, too small a space between the m number of ejection orifices 55 facing the same opening 58 is considered to lead to an increase in the probability that the vapor deposition streams 56 therefrom are mixed with each other, eventually increasing the probability that the vapor deposition particles in the vapor deposition streams 56 collide each other. As a result, the mean free path of the vapor deposition particles is locally high, which probably increases the blur amount.

Hence, in the present embodiment, the film-thickness distribution of the thin film is calculated from the following formula for each ejection orifice 55, and the calculated distributions of all the ejection orifices 55 are summed.

$$\cos^{(n_i+3)}\theta_i \times r_i/R_i \qquad (1)$$

The m number of ejection orifices 55 facing the same opening 58 are spaced from each other, i.e., arranged apart from each other, so that the obtained sum (following formula (2)) is 1 or smaller.

$$\Sigma \cos^{(n_i+3)}\theta_i \times r_i/R_i \qquad (2)$$

The distribution represented by the above formula (1) is obtained by multiplying the film-thickness distribution of each ejection orifice 55 based on the law of cosine to the $n^{th}$ power by the ratio of the actual film-formation rate of the ejection orifice 55 to the maximum film-formation rate of the ejection orifice 55. This distribution is regarded as a distribution expecting the film-thickness distribution of the thin film to be formed at the actual rate. Hereinafter, a distribution represented by the above formula (1) is also referred to as an expected film-thickness distribution.

Arranging the ejection orifices 55 as described above enables prevention of formation of the patterned thin film 71 at a film-formation rate higher than the maximum film-formation rate, in the entire region in which the patterned thin film 71 is to be formed. Hence, even if the vapor deposition streams 56 from different ejection orifices 55 are mixed with each other to cause collision of vapor deposition particles in the vapor deposition streams 56, the influence on the blur width can be made smaller than the case where the patterned thin film is formed at a rate higher than the maximum film-formation rate. Therefore, the blur width can be prevented from increasing.

As described above, in the present embodiment, the multiple (m number of) ejection orifices 55 are arranged below each opening 58, the vapor deposition in the light-emitting layer vapor deposition step S3 is performed under the condition of $r_i < R_i$, and the multiple (m number of) ejection orifices 55 facing the same open hole 58 are spaced from each other such that the sum of the distributions represented by the above formula (1) is 1 or smaller. Accordingly, in the light-emitting layer vapor deposition step S3, an increase in the blur width was suppressed while the film-formation time was shortened.

The m number of ejection orifices 55 facing the same opening 58 are arranged in the relative moving direction of the substrate 70, i.e., the Y-axis direction. Hence, the vapor deposition particles from the ejection orifices 55 travel to the substrate 70 in parallel with the relative moving direction of the substrate 70. Therefore, compared to the case where only one ejection orifice 55 is arranged for one opening 58 or the case where the m number of ejection orifices 55 facing the same opening 58 are not arranged in the Y-axis direction, the film-formation rate can be effectively raised, and the productivity can be greatly enhanced.

In the present embodiment, the maximum film-formation rates of the m number of ejection orifices 55 facing the same opening 58 may be the same as each other, the actual film-formation rates thereof may be the same as each other, and the n values thereof may be the same as each other. With such values, in the case of increasing the number of the vapor deposition sources 51 and/or the ejection orifices 55 to increase the throughputs by raising the film-formation rate, the number of control parameters can be reduced, and thus the system of the vapor deposition apparatus 50 can be easily controlled.

Also in the present embodiment, at least two of the m number of the ejection orifices 55 facing the same opening 58 may be different in at least one of the maximum film-formation rate, the actual film-formation rate, and the n value. Thereby, the degree of freedom in selecting the structure of the vapor deposition apparatus 50, the materials used, the vapor deposition sources 51, and the properties of the vapor deposition sources 51 increases to enhance the productivity of the vapor deposition apparatus 50, so that a production method with an enhanced productivity can be achieved.

Hence, the following points can be made for at least two of the m number of the ejection orifices 55 facing the same opening 58. (1) Even when the maximum film-formation rates are different from each other, the actual film-formation rates may be the same as each other, and the n values may be the same as each other. (2) Even when the actual film-formation rates are different from each other, the maximum film-formation rates may be the same as each other, and the n values may be the same as each other. (3) Even when the n values are different from each other, the maximum film-formation rates may be the same as each other, and the actual film-formation rates may be the same as each other. (4) Even when the maximum film-formation rates are different from each other and the actual film-formation rates are different from each other, the n values may be the same as each other. (5) Even when the maximum film-formation rates are different from each other and the n values are different from each other, the actual film-formation rates may be the same as each other. (6) Even when the actual film-formation rates are different from each other and the n values are different from each other, the maximum film-formation rates may be the same as each other. (7) The maximum film-formation rates may be different from each other, the actual film-formation rates may be different from each other, and the n values may also be different from each other.

Here, what is meant by "the maximum film-formation rates are the same as each other" is that the difference between the rates is 0.1 Å/sec or less. What is meant by "the actual film-formation rates are the same as each other" is that the difference between the rates is 0.1 Å/sec or less. What is meant by "the n values are the same as each other" is that the difference between the values is 0.1 or less.

Also, what is meant by "the maximum film-formation rates are different from each other" is that the difference between the rates is greater than 0.1 Å/sec. What is meant by "the actual film-formation rates are different from each other" is that the difference between the rates is greater than 0.1 Å/sec. What is meant by "the n values are different from each other" is that the difference between the values is greater than 0.1.

Now, the calculation results of summing the expected film-thickness distributions are described.

Figure 8:
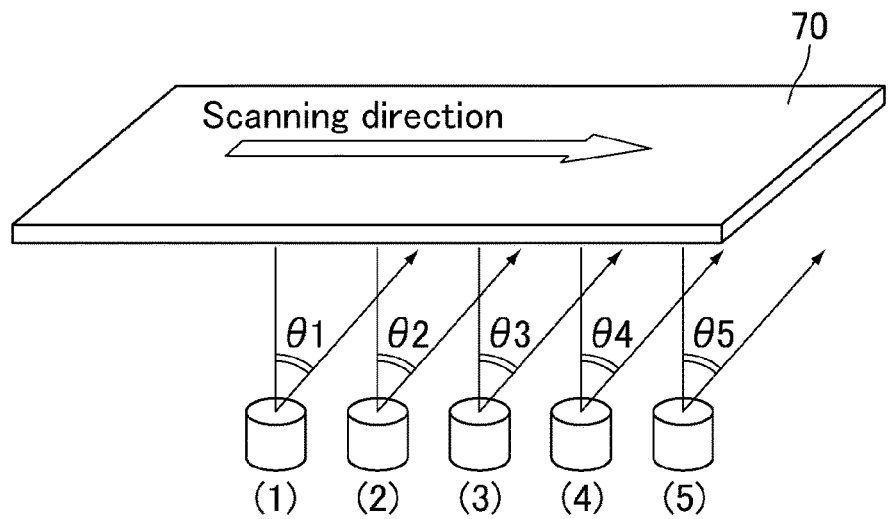
FIG. 8 is a schematic view of ejection orifices and the substrate for calculation of the sum of the expected film thickness distributions.

FIG. 8 is a schematic view of ejection orifices and the substrate for calculation of the sum of the expected film thickness distributions.

As illustrated in FIG. 8, five ejection orifices (1) to (5) were arranged in parallel with the scanning direction of the substrate 70. The space between each ejection orifice and the substrate 70 was set to 250 mm. The shapes of the ejection orifice were expected to be the same, and the n value of each ejection orifice was set to 50. The space between adjacent ejection orifices was all set to 100 mm. Every ratio of the actual film-formation rate of an ejection orifice to the maximum film-formation rate of the ejection orifice ($r_i/R_i$) was set to 0.96.

Figure 9:
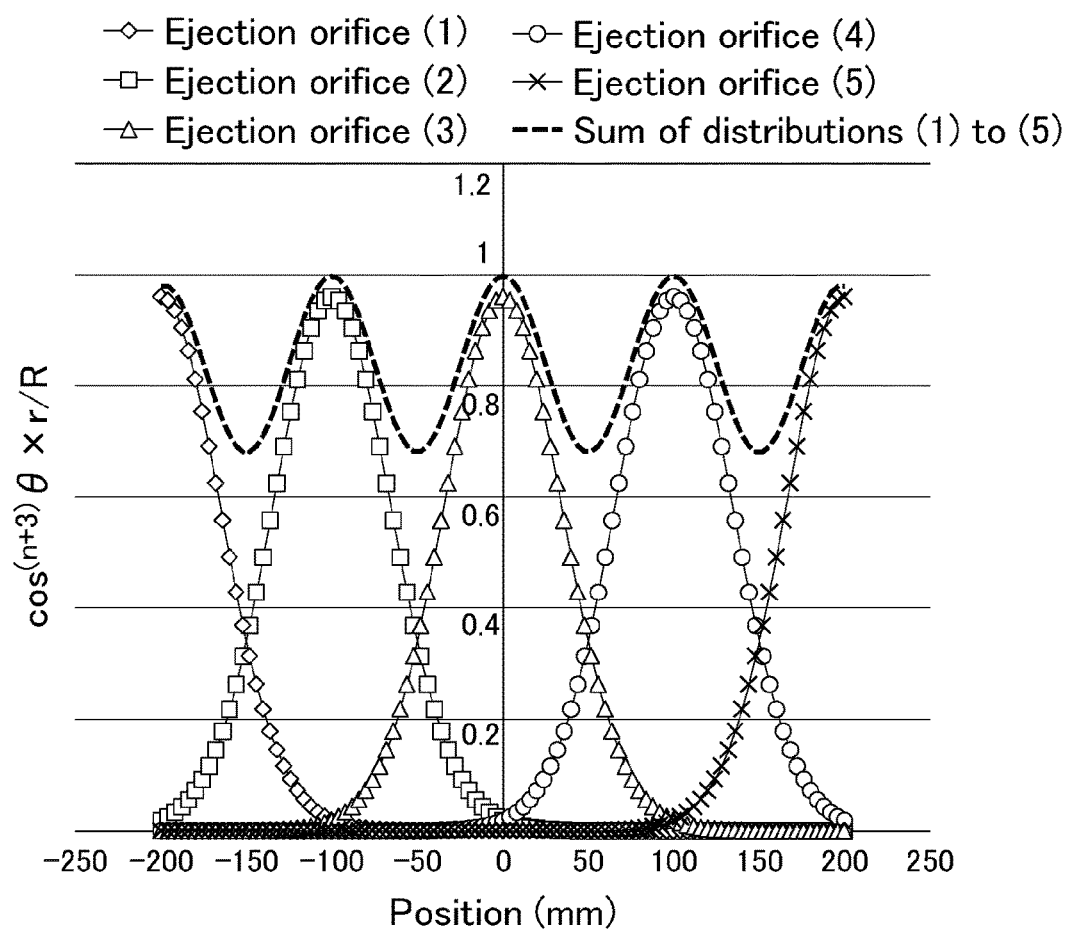
FIG. 9 shows expected film thickness distributions of the five ejection orifices in the scanning direction of the substrate, and the sum of these distributions.

FIG. 9 shows expected film thickness distributions of the five ejection orifices in the scanning direction of the substrate, and the sum of these distributions.

As shown in FIG. 9, the sum of all the ejection orifices (1) to (5) was 1 or less, and the maximum value thereof was 0.998.

Next, another calculation result is shown. Here, with an assumption that the shapes of the ejection orifices (1) to (5) are different, the n value of each ejection orifice, and the ratio of the actual film-formation rate to the maximum film-formation rate of each ejection orifice ($r_i/R_i$) were set as shown in the following Table 1. The space between each ejection orifice and the substrate 70 was set to 250 mm. The space between adjacent ejection orifices 55 was set to 100 mm.

TABLE 1

| | Ejection orifice | | | | |
|---|---|---|---|---|---|
| | (1) | (2) | (3) | (4) | (5) |
| n value | 40 | 15 | 10 | 20 | 30 |
| ri/Ri | 0.6 | 0.63 | 0.54 | 0.58 | 0.65 |

Figure 10:
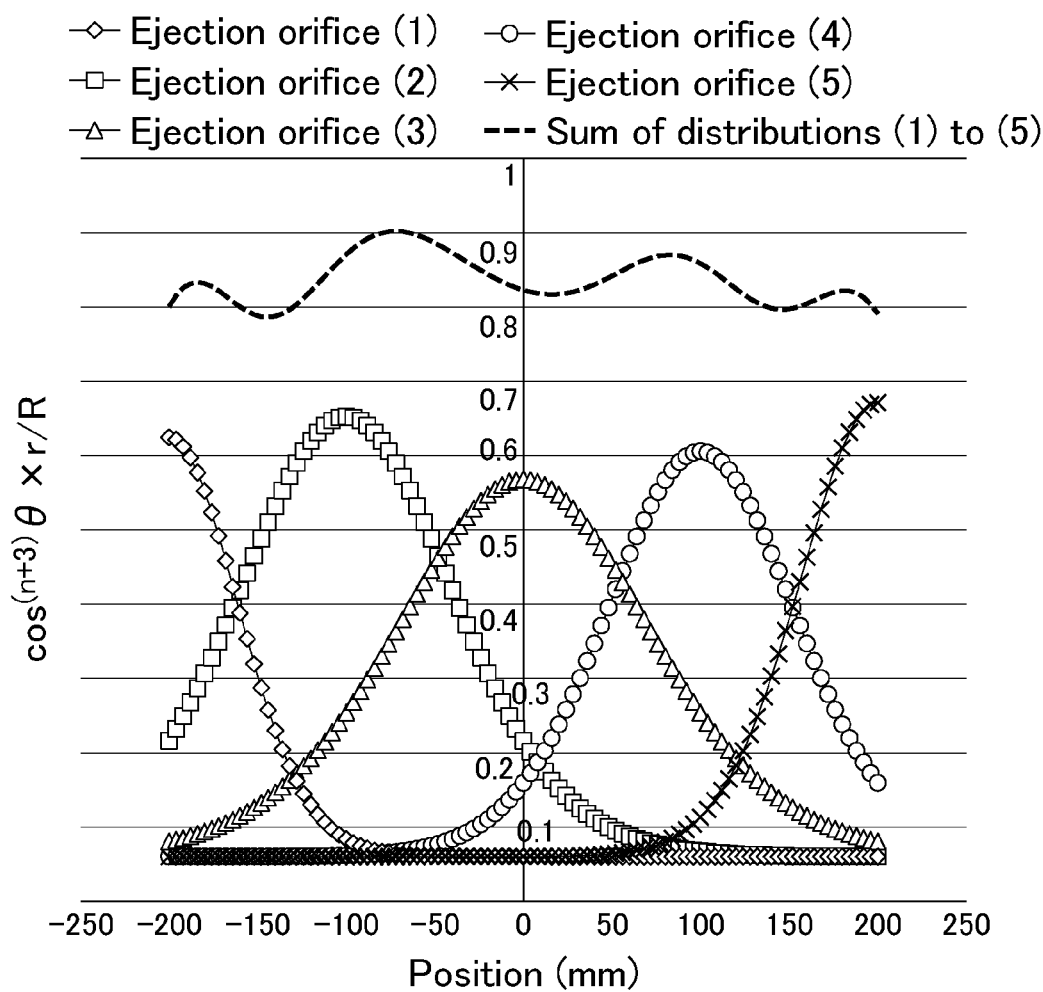
FIG. 10 shows other expected film thickness distributions of the five ejection orifices in the scanning direction of the substrate, and the sum of these distributions.

FIG. 10 shows other expected film thickness distributions of the five ejection orifices in the scanning direction of the substrate, and the sum of these distributions.

As shown in FIG. 10, the sum of the expected film-thickness distributions of all the ejection orifices (1) to (5) was 1 or smaller, and the maximum value thereof was 0.896.

Figure 11:
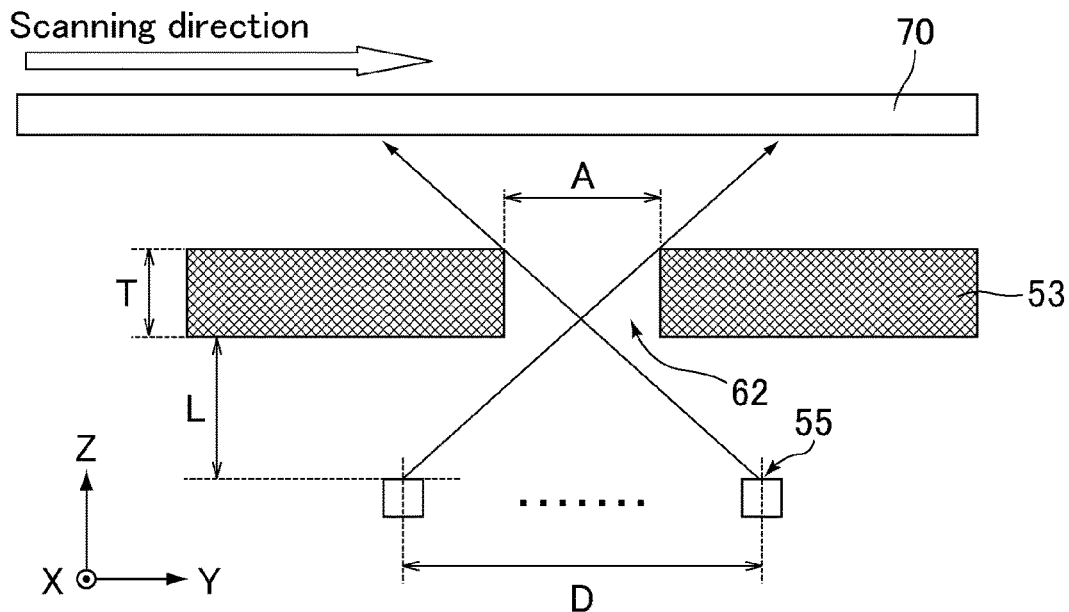
FIG. 11 is a schematic cross-sectional view of components in the light-emitting layer vapor deposition step in Embodiment 1.

Next, the preferred upper limit for the space between the ejection orifices 55 present below the same opening 58 is described. FIG. 11 is a schematic cross-sectional view of components in the light-emitting layer vapor deposition step in Embodiment 1. FIG. 11 illustrates the cross section parallel to the scanning direction of the substrate, i.e., the YZ plane.

The present embodiment aims to raise the film-formation rate by allowing the vapor deposition particles from the ejection orifices 55 present below the same open hole 58 to travel to the openings 62 of the mask 53. Accordingly, from the viewpoint of shortening the film-formation time, the upper limit for the space between the ejection orifices 55 is preferably determined based on the positional relations that allow the vapor deposition particles to barely pass through the openings 62 of the mask 53. Here, as illustrated in FIG. 11, the length of each opening 62 of the mask 53 in the scanning direction of the substrate 70, i.e., in the Y-axis direction, is referred to as A; the thickness of the mask 53 is referred to as T; the distance between each ejection orifice 55 and the mask 53 is referred to as L; the number of the ejection orifices 55 present below the same open hole 58 is referred to as J; and the maximum range within which the ejection orifices 55 can be arranged, i.e., the distance between the terminal ejection orifices 55 (usually, the centers of these terminal ejection orifices 55) is referred to as D. From the relation of $A/T \geq D/(T+L)$, D preferably satisfies the relation of $D \leq A \times (T+L)/T$ in order to satisfy the above positional relations.

Also, in the case of arranging J number of ejection orifices 55 at equal intervals within the distance D, the interval d between adjacent ejection orifices 55 preferably satisfies the relation of $d \leq A \times (T+L)/T/(J-1)$.

For example, in the case that A is 0.3 mm, T is 0.1 mm, L is 250 mm, and J is 5 to arrange five ejection orifices at equal intervals, the interval between adjacent ejection orifices is preferably set to about 188 mm or smaller. In the case that the five ejection orifices are not arranged at equal intervals, all the ejection orifices are preferably positioned within the range of about 750 mm. That is, the distance between the terminal ejection orifices is preferably set to about 750 mm or smaller.

In the case that the lengths of the openings 62 facing the same opening 58, i.e., the lengths of the openings 62 included in the same opening group 61, are not uniform, the ejection orifices 55 are preferably arranged to satisfy the above relation with the shortest length of the openings 62 as A.

Next, the results of studies on the relation between the film-formation rate and the n value are shown.

Figure 12:
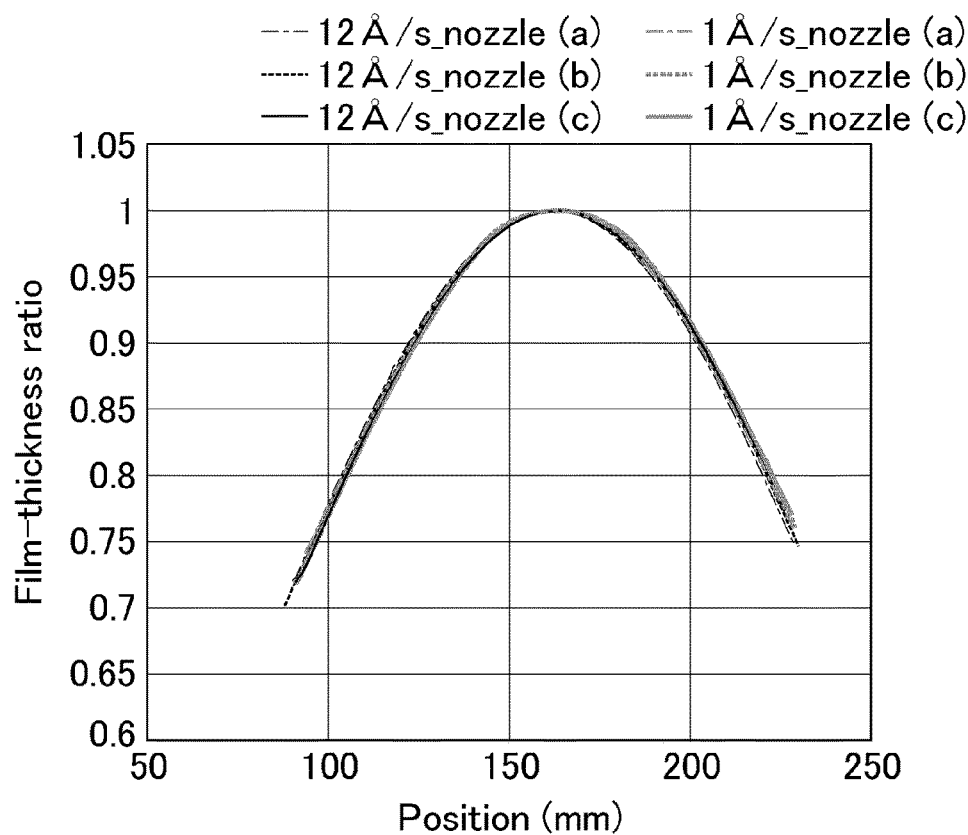
FIG. 12 shows film-thickness distributions obtained by forming thin films using three nozzles (a) to (c) at a film-formation rate of 1 Å/sec or 12 Å/sec.

FIG. 12 shows film-thickness distributions obtained by forming thin films using three nozzles (a) to (c) at a film-formation rate of 1 Å/sec or 12 Å/sec. Here, the vapor deposition material used is Alq3 (tris(8-quinolinolato)aluminum). Every nozzle had a cylindrical shape with an inner diameter of 4 mm and a length of 6 mm. Each ejection orifice had a planar shape of a circle with a diameter of 4 mm. As shown in FIG. 12, the shapes of the film-thickness distributions were substantially the same at various film-formation rates, and the n values were the same at about 2.5. These results show that the film-formation rate when the n value is measured is not particularly limited, and can be appropriately set. Usually, the film-formation rate when the n value is measured may be set at 1.0 Å/sec to 2.0 Å/sec.

Figure 13:
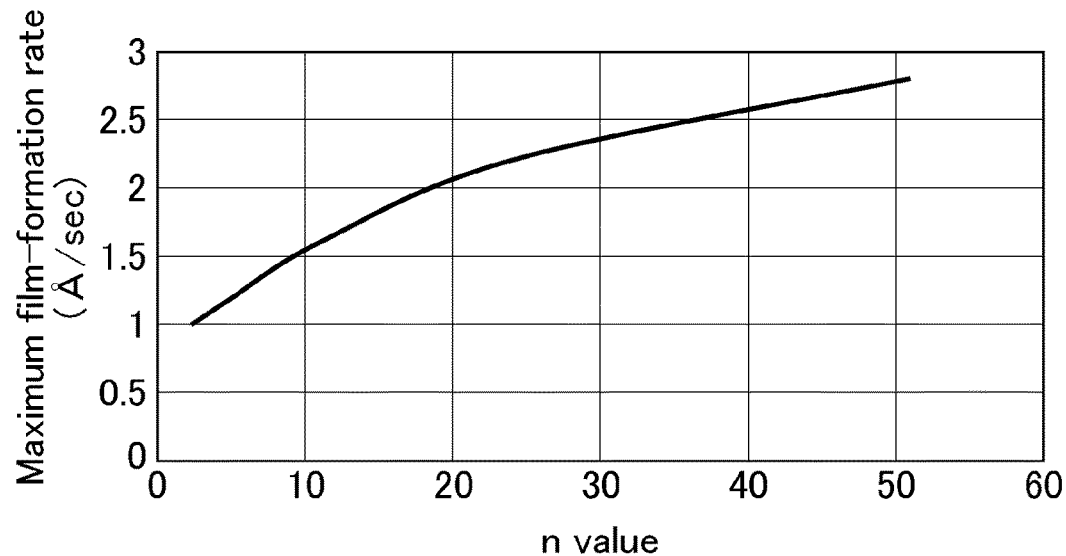
FIG. 13 is a graph showing the relation between the n value and the maximum film-formation rate.

Also, the relation between the n value and the maximum film-formation rate was studied using nozzles having various shapes, and the results shown in FIG. 13 and the following Table 2 were obtained. FIG. 13 is a graph showing the relation between the n value and the maximum film-formation rate.

TABLE 2

| n value | Maximum film-formation rate (Å/sec) |
|---|---|
| 2.3 | 1 |
| 5.1 | 1.2 |
| 11 | 1.6 |

TABLE 2-continued

| n value | Maximum film-formation rate (Å/sec) |
|---|---|
| 24 | 2.2 |
| 51 | 2.8 |

Here, the space between each ejection orifice and the substrate was 250 mm, and the space between the mask and the substrate was 1 mm. The maximum film-formation rate was determined by the method described above using FIG. 7. As shown in FIG. 13 and the above Table 2, the maximum film-formation rate increases as the n value increases, but the maximum film-formation rate is gradually saturated.

Hereinafter, an alternative example of the present embodiment is described.

The vapor deposition materials used for the vapor deposition sources 51 can be appropriately selected independently. The materials therefore may be the same as or different from each other. That is, in the present embodiment, vapor co-deposition may be performed.

The number of the vapor deposition sources 51 is not particularly limited, and may be one, for example. In this case, multiple ejection orifices may be provided in the Y-axis direction for the one vapor deposition source.

Also, the vapor deposition sources 51, the limiting plate 52, the mask 53, and the substrate 70 may face any direction as long as they are arranged in the stated order. For example, the structure may be placed upside down, and the vapor deposition sources 51, the limiting plate 52, the mask 53, and the substrate 70 may be arranged from the top in the stated order. Also, the above structure may be rotated by 90° with the Y-axis as the center, and the vapor deposition sources 51, the limiting plate 52, the mask 53, and the substrate 70 may be arranged horizontally.

The organic EL display device 1 may be a monochrome display device, and each pixel may not be divided into sub-pixels. In this case, in the light-emitting layer vapor deposition step S3, the vapor deposition may be performed only once to form a light-emitting layer in only one color.

In vapor deposition steps other than the light-emitting layer vapor deposition step S3, patterned thin films may be formed in the same manner as in the light-emitting layer vapor deposition step S3. For example, the electron transport layer 24 may be formed separately for the sub-pixels 2R, 2G and 2B in the respective colors.

Hereinafter, an example and comparative examples are described.

In the present example, three vapor deposition sources were arranged in the Y-axis direction, namely in the scanning direction of the substrate, and ejection orifices were provided for the respective vapor deposition sources in parallel with the X-axis direction, i.e., perpendicularly to the scanning direction of the substrate. Hence, there were three ejection orifices arranged in the Y-axis direction. The same vapor deposition material, namely Alq3 was used for every vapor deposition source. Each ejection orifice had a planar shape of a circle with a diameter of 2 mm. The distance between the substrate and each ejection orifice was 220 mm. The space between ejection orifices adjacent in the Y-axis direction was all 40 mm. The n value of each ejection orifice was 250, and the maximum film-formation rate of each ejection orifice was 1 Å/sec. The actual film-formation rate of each ejection orifice was 0.95 Å/sec or lower, and the film-formation rate of each ejection orifice was set to the same value. The mask had a thickness of 0.1 mm, and was provided with rectangular (slit-like) openings. Each opening had a length in the Y-axis direction of 0.3 mm, and a length (width) in the X-axis direction of 0.1 mm. The vapor deposition step was performed multiple times at various film-formation rates, so that patterned thin films with a maximum film thickness of 150 nm were formed. In the present example, when the actual film-formation rate was 0.95 Å/sec, the sum of the expected film-thickness distributions represented by the above formula (2) was 1 or less, and the maximum value thereof was 0.966. In place of the above formula (2), the following formula (3) may be used.

$$\Sigma \cos^{(n_i+3)}(\tan^{-1}(|Z \times (i-1)-X|/TS)) \times r_i/R_i \quad (3)$$

In the formula, X, Z, and TS respectively represent the position, the interval of ejection orifices adjacent in the Y-axis direction, and the distance between the substrate and each ejection orifice.

In the present comparative example, the vapor deposition step was performed multiple times at multiple film-formation rates to form patterned thin films with a maximum film thickness of 150 nm in the same manner as in Example 1, except that the number of vapor deposition sources was one, and the actual film-formation rate of each ejection orifice was set to 3 Å/sec or lower. In the present comparative example, only one ejection orifice is arranged in the Y-axis direction.

Figure 14:
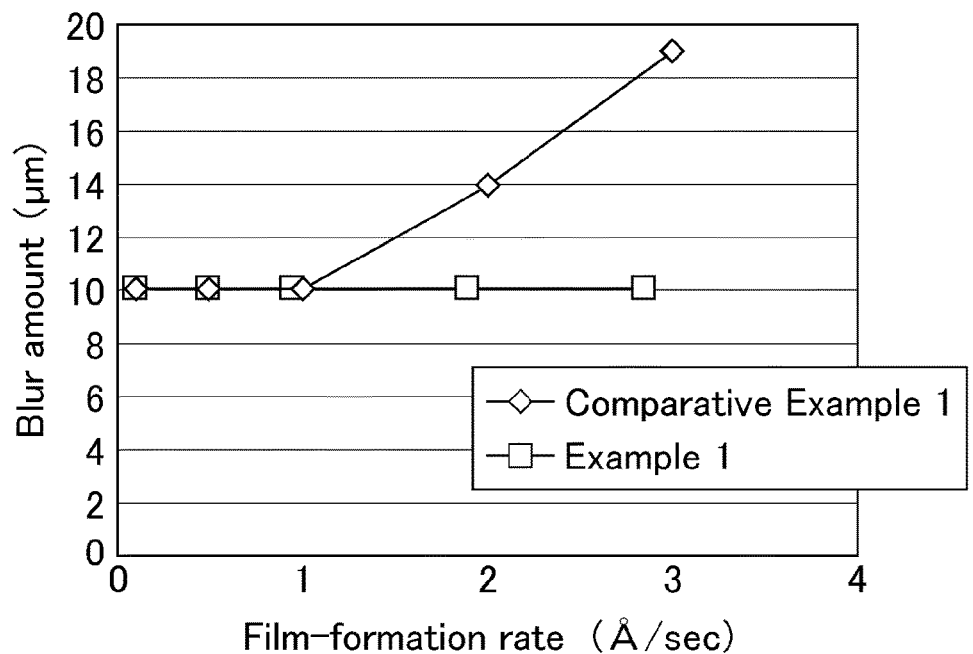
FIG. 14 is a graph showing the relation between the film-formation rate and the blur amount in each of Example 1 and Comparative Example 1.
Figure 15:
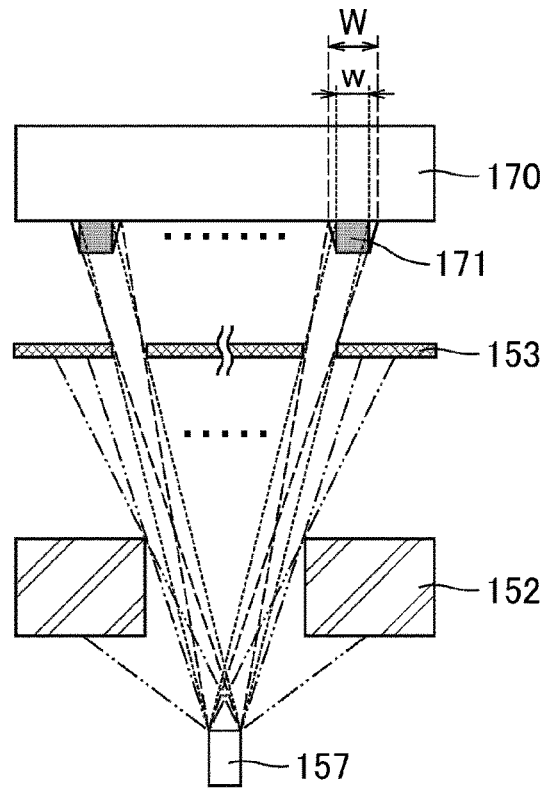
FIG. 15 is a schematic cross-sectional view of components during scanning vapor deposition (method carrying out vapor deposition while moving (scanning) the substrate) studied by the present inventors.
Figure 16:
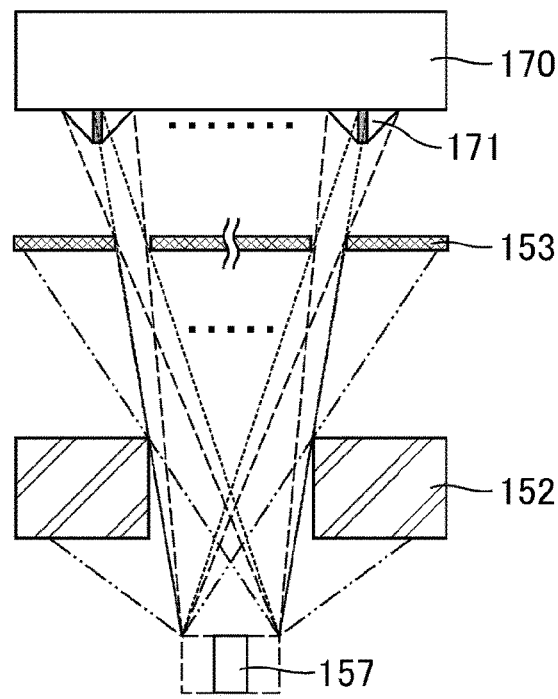
FIG. 16 is a schematic cross-sectional view of components during scanning vapor deposition (method carrying out vapor deposition while moving (scanning) the substrate) studied by the present inventors.

FIG. 14 is a graph showing the relation between the film-formation rate and the blur amount in each of Example 1 and Comparative Example 1. The following Table 3 shows the film-formation rates and the blur amounts in Example 1 and Comparative Example 1. The film-formation rate in Example 1 is the total film-formation rate of the three ejection orifices arranged in the Y-axis direction.

| Film-formation rate (Å/sec) | Blur amount (μm) | |
|---|---|---|
| | Comparative Example 1 | Example 1 |
| 0.1 | 10 | 10 |
| 0.5 | 10 | 10 |
| 0.95 | — | 10 |
| 1 | 10 | — |
| 1.9 | — | 10 |
| 2 | 14 | — |
| 2.85 | — | 10 |
| 3 | 19 | — |

As shown in FIG. 14 and Table 3, the blur amount increased as the film-formation rate was raised in Comparative Example 1, while the blur amount did not increase when the film-formation rate was raised in Example 1. Therefore, in Example 1, an organic EL element was formed with high precision and a high productivity.

In the present comparative example, a patterned thin film with a maximum thickness of 150 nm was formed in the same manner as in Example 1, except that the actual film-formation rate of each ejection orifice was set to 1.5 Å/sec. Also, in the present comparative example, the vapor deposition step was performed only once at the above film-formation rate, so that one patterned thin film was formed. In the present comparative example, there were three ejection orifices arranged in the Y-axis direction.

In the present comparative example, the sum of the expected film-thickness distributions represented by the above formula (2) was greater than 1, and the maximum value thereof was 1.549. Also in the present comparative example, the blur amount of the patterned thin film formed was 14 μm, which is large compared to the blur amount in Example 1 of 10 μm.

REFERENCE SIGNS LIST

1: Organic EL display device
2: Pixel
2R, 2G, 2B: Sub-pixel
10: TFT substrate
11: Insulating substrate
12: TFT
13: Interlayer film
13a: Contact hole
14: Conductive line
15: Edge cover
15R, 15G, 15B: Opening
20: Organic EL element
21: First electrode
22: Hole injection/hole transport layer (organic layer)
23R, 23G, 23B: Light-emitting layer (organic layer)
24: Electron transport layer (organic layer)
25: Electron injection layer (organic layer)
26: Second electrode
30: Adhesive layer
40: Sealing substrate
50: Vapor deposition apparatus
51: Vapor deposition source
52, 152: Limiting plate
53, 153: Mask (vapor deposition mask)
54: Shutter
55: Ejection orifice
56: Vapor deposition stream
57, 157: Nozzle
58: Opening
59: Wall
60: Base
61: Opening group
62: Opening
70, 170: Substrate (film formation target substrate)
71, 171: Patterned thin film

The invention claimed is:

1. A method for producing an organic electroluminescent element, comprising
a vapor deposition step of forming a patterned thin film by allowing vapor deposition particles to adhere to a substrate while moving the substrate relative to one or more vapor deposition sources, a limiting plate, and a mask, with the substrate being spaced from the mask,
the one or more vapor deposition sources, the limiting plate, the mask, and the substrate being arranged in the stated order,
the limiting plate being provided with openings,
the one or more vapor deposition sources each being provided with ejection orifices that face the respective openings,
the vapor deposition step including vapor deposition carried out under the condition of ri<Ri,
the ejection orifices facing the same opening being spaced from each other to give a sum of distributions represented by the following formula (1) that is equal to or smaller than 1 (≤1), $$\cos^{(n_i+3)}\theta_i \times r_i / R_i \qquad (1)$$

wherein Ri represents a maximum film-formation rate of an ejection orifice i among the ejection orifices facing the same opening,
i represents an integer of 1 or greater and m or smaller,
m represents the number of the ejection orifices facing the same opening,
ri represents the actual film-formation rate of the ejection orifice i in the vapor deposition step,
ni is an n value, which is zero or more, of the ejection orifice i, and
θi represents an angle formed by a main film formation direction and a segment connecting the ejection orifice i and a point within the film formation region.

2. The method for producing an organic electroluminescent element of claim 1,
wherein the ejection orifices facing the same opening are arranged along the relative moving direction of the substrate.

3. The method for producing an organic electroluminescent element of claim 1,
wherein the ejection orifices facing the same opening are the same in the maximum film-formation rate, the actual film-formation rate, and the n value.

4. The method for producing an organic electroluminescent element of claim 1,
wherein at least two of the ejection orifices facing the same opening are different in at least one of the maximum film-formation rate, the actual film-formation rate, and the n value.

5. The method for producing an organic electroluminescent element of claim 1,
wherein the relation of D≤A×(T+L)/T holds,
where D represents the distance between two most distant ejection orifices among the ejection orifices facing the same opening,
A represents the length of an opening of the mask in the relative moving direction of the substrate,
T represents the thickness of the mask, and
L represents the distance between the mask and each of the two ejection orifices.

6. An organic electroluminescent display device comprising
an organic electroluminescent element produced by the method for producing an organic electroluminescent element of claim 1.

* * * * *